(12) United States Patent
Tak et al.

(10) Patent No.: US 9,136,430 B2
(45) Date of Patent: Sep. 15, 2015

(54) SEMICONDUCTOR BUFFER STRUCTURE, SEMICONDUCTOR DEVICE INCLUDING THE SAME, AND METHOD OF MANUFACTURING SEMICONDUCTOR DEVICE USING SEMICONDUCTOR BUFFER STRUCTURE

(71) Applicants: Young-jo Tak, Hwaseong-si (KR); Jae-kyun Kim, Hwaseong-si (KR); Joo-sung Kim, Hwaseong-si (KR); Jun-youn Kim, Hwaseong-si (KR); Jae-won Lee, Seoul (KR); Hyo-ji Choi, Seoul (KR)

(72) Inventors: Young-jo Tak, Hwaseong-si (KR); Jae-kyun Kim, Hwaseong-si (KR); Joo-sung Kim, Hwaseong-si (KR); Jun-youn Kim, Hwaseong-si (KR); Jae-won Lee, Seoul (KR); Hyo-ji Choi, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/963,476

(22) Filed: Aug. 9, 2013

(65) Prior Publication Data

US 2014/0045284 A1 Feb. 13, 2014

(30) Foreign Application Priority Data

Aug. 9, 2012 (KR) .................. 10-2012-0087350
Jul. 25, 2013 (KR) .................. 10-2013-0088249

(51) Int. Cl.
*H01L 33/12* (2010.01)
*H01L 21/02* (2006.01)
*H01L 33/00* (2010.01)

(52) U.S. Cl.
CPC ............ *H01L 33/12* (2013.01); *H01L 21/0251* (2013.01); *H01L 21/0254* (2013.01);

(Continued)

(58) Field of Classification Search
CPC .................... H01L 33/12; H01L 21/02458
USPC .............. 438/37, 483; 257/E21.126, E21.127
See application file for complete search history.

(56) References Cited

U.S. PATENT DOCUMENTS 6,703,690 B2 3/2004 Thakur et al.
6,956,250 B2 10/2005 Borges et al.

(Continued)

FOREIGN PATENT DOCUMENTS

DE 10 2004 038573 A1 3/2006
EP 2 434 532 A1 3/2012

(Continued)

OTHER PUBLICATIONS

Partial European Search Report issued in European Application No. 13179953.8 issued Sep. 30, 2013.

(Continued)

*Primary Examiner* — Amar Movva
(74) *Attorney, Agent, or Firm* — McDermott Will & Emery LLP

(57) ABSTRACT

A method of manufacturing a semiconductor device includes forming a silicon substrate, forming a buffer layer on the silicon substrate, and forming a nitride semiconductor layer on the buffer layer. The buffer layer includes a first layer, a second layer, and a third layer. The first layer includes $Al_xIn_yGa_{1-x-y}N$ ($0 \leq x \leq 1$, $0 \leq y \leq 1$, $0 \leq x+y \leq 1$) and has a lattice constant LP1 that is smaller than a lattice constant LP0 of the silicon substrate. The second layer is formed on the first layer, includes $Al_xIn_yGa_{1-x-y}N$ ($0 \leq x < 1$, $0 \leq y < 1$, $0 \leq x+y < 1$), and has a lattice constant LP2 that is greater than LP1 and smaller than LP0. The third layer is formed on the second layer, includes $Al_xIn_yGa_{1-x-y}N$ ($0 \leq x < 1$, $0 \leq y < 1$, $0 \leq x+y < 1$), and has a lattice constant LP3 that is smaller than LP2.

28 Claims, 31 Drawing Sheets

(52) U.S. Cl.
CPC .... *H01L21/02381* (2013.01); *H01L 21/02458* (2013.01); *H01L 21/02505* (2013.01); *H01L 21/02507* (2013.01); *H01L 33/0066* (2013.01); *H01L 33/0079* (2013.01)

(56) References Cited

U.S. PATENT DOCUMENTS

| | | | |
|---|---|---|---|
| 7,518,154 | B2 | 4/2009 | Otsuka et al. |
| 7,614,253 | B2 | 11/2009 | Ouellet et al. |
| 7,687,888 | B2 | 3/2010 | Marchand et al. |
| 8,044,414 | B2 | 10/2011 | Hori et al. |
| 8,264,001 | B2 | 9/2012 | Sato |
| 8,952,419 | B2 | 2/2015 | Tak et al. |
| 2005/0110043 | A1 | 5/2005 | Otsuka et al. |
| 2010/0237387 | A1 | 9/2010 | Sato |
| 2010/0244096 | A1 | 9/2010 | Sato |

FOREIGN PATENT DOCUMENTS

| | | |
|---|---|---|
| EP | 2 602 810 A1 | 6/2013 |
| JP | H04-73930 A | 3/1992 |
| JP | 2004-035340 A | 2/2004 |
| JP | 2005-158889 A | 6/2005 |
| JP | 4-282278 B2 | 6/2009 |
| JP | 2010-225703 A | 10/2010 |
| JP | 2012-015306 A | 1/2012 |
| KR | 10-0457415 | 11/2004 |
| KR | 10-2006-0112228 A | 10/2006 |
| KR | 10-0758124 B1 | 9/2007 |
| KR | 10-2010-0024944 A | 3/2010 |
| KR | 10-0955821 B1 | 5/2010 |
| KR | 10-2012-0032329 A | 4/2012 |
| WO | 2007-096405 A1 | 8/2007 |
| WO | 2011-039181 A1 | 4/2011 |

OTHER PUBLICATIONS

Philippe F. Smet et al., "Selecting Conversion Phosphors for White Light-Emitting Diodes," Journal of the Electrochemical Society, 158 (6) R37-R54 (2011).

Extended European Search Report issued in European Patent Application No. EP 13179953.8-1552/2696365 dated Jan. 24, 2014.

SEMICONDUCTOR BUFFER STRUCTURE, SEMICONDUCTOR DEVICE INCLUDING THE SAME, AND METHOD OF MANUFACTURING SEMICONDUCTOR DEVICE USING SEMICONDUCTOR BUFFER STRUCTURE

CROSS-REFERENCE TO RELATED APPLICATIONS

This application claims benefit of the priority of Korean Patent Applications No. 10-2012-0087350, filed on Aug. 9, 2012, and No. 10-2013-0084249, filed on Jul. 25, 2013 in the Korean Intellectual Property Office, the entire contents of which are hereby incorporated by reference.

TECHNICAL FIELD

The present inventive concept relates to a semiconductor buffer structure, a semiconductor device including the same, and a method of manufacturing a semiconductor device using a semiconductor buffer structure.

BACKGROUND

Many nitride-based semiconductor devices use a sapphire substrate. However, a sapphire substrate is expensive, is too hard to manufacture chips, and has low electric conductivity. Furthermore, a sapphire substrate may not be easily manufactured at a large size due to its warpage at high temperatures, such as during epitaxial growth, and due to its low thermal conductivity. In order to prevent the above problems, nitride-based semiconductor devices using a silicon (Si) substrate instead of a sapphire substrate have been developed. Since a Si substrate has higher thermal conductivity than a sapphire substrate, the Si substrate is not warped greatly at a high temperature for growing a nitride thin film, thereby making it possible to grow a large thin film on the Si substrate.

However, when a nitride thin film is grown on a Si substrate, a dislocation density may be increased due to a mismatch in lattice constants between the Si substrate and the nitride thin film and cracks may occur due to tensile stress which is generated by mismatch in thermal expansion coefficients between the Si substrate and the nitride thin film. Accordingly, many types of buffer structures are studied to grow a nitride thin film, which has high crystallinity and has no crack, on the Si substrate.

SUMMARY

The present inventive concept provides a semiconductor buffer structure for reducing cracks in a nitride-based semiconductor thin film, a semiconductor device including the semiconductor buffer structure, and a method of manufacturing a semiconductor device using a semiconductor buffer structure.

An aspect of the present inventive concept relates to a method of manufacturing a semiconductor device, including preparing a silicon substrate. A buffer layer is formed on the silicon substrate. A nitride semiconductor layer is formed on the buffer layer. The buffer layer includes a first layer, a second layer and a third layer. The first layer includes $Al_xIn_yGa_{1-x-y}N$ ($0 \le x \le 1$, $0 \le y \le 1$, $0 \le x+y \le 1$) and has a lattice constant LP1 smaller than a lattice constant LP0 of the silicon substrate. The second layer is formed on the first layer, includes $Al_xIn_yGa_{1-x-y}N$ ($0 \le x < 1$, $0 \le y < 1$, $0 \le x+y < 1$), and has a lattice constant LP2 greater than LP1 and smaller than LP0.

The third layer is formed on the second layer, includes $Al_xIn_yGa_{1-x-y}N$ ($0 \le x \le 1$, $0 \le y \le 1$, $0 \le x+y \le 1$), and has a lattice constant LP3 smaller than LP2.

The lattice constant LP3 of the third layer may be equal to or greater than LP1.

The lattice constant LP3 of the third layer may be greater than LP1.

The third layer may be formed to have a thickness such that lattice relaxation occurs.

The second layer may have a lattice constant distribution that increases along a thickness direction, and the third layer may have a lattice constant that is smaller than a lattice constant average of the second layer.

The lattice constant distribution of the second layer may increase continuously.

The buffer layer may further include a fourth layer that is formed on the third layer, includes $Al_xIn_yGa_{1-x-y}N$ ($0 \le x < 1$, $0 \le y < 1$, $0 \le x+y < 1$), and has a lattice constant distribution that increases along a thickness direction. The fourth layer may have the same lattice constant as the second layer.

The buffer layer may further include a fourth layer that is formed on the third layer, includes $Al_xIn_yGa_{1-x-y}N$ ($0 \le x < 1$, $0 \le y < 1$, $0 \le x+y < 1$), and has a lattice constant LP4 that is greater than LP2.

The buffer layer may further include a plurality of layers that are formed of a material including $Al_xIn_yGa_{1-x-y}N$ ($0 \le x < 1$, $0 \le y < 1$, $0 \le x+y < 1$) and formed on the third layer. The lattice constant of each of the plurality of layers may be greater than LP3, and the plurality of layers may be staked in ascending order of lattice constant.

The silicon substrate may be doped with a dopant, and the dopant may include at least one of B, Al, Mg, Ca, Zn, Cd, Hg, and Ga.

A doping concentration of the dopant may be determined such that the silicon substrate has a resistivity of about 1 Ωcm or less.

The silicon substrate may include: a main portion; an edge portion surrounding the main portion; and a crack prevention portion formed on the edge portion with a random crystalline surface direction.

The crack prevention portion may include an uneven portion formed on a top surface of the edge portion.

The crack prevention portion may include a dielectric film formed on a top surface of the edge portion.

The crack prevention portion may be formed by performing ion implantation on a top surface of the edge portion.

The buffer layer may be formed to apply a compressive stress to the nitride semiconductor layer.

The method may further include forming a device layer on the nitride semiconductor layer.

The device layer may include a light-emitting diode (LED) structure, a field-effect transistor (FET) structure, a high electron mobility transistor (HEMT) structure, or a Schottky diode structure.

The method may further include forming an interface control layer between the buffer layer and the nitride semiconductor layer, wherein the interface control layer is grown according to a growth condition for controlling a roughness increase rate with respect to a roughness of the buffer layer.

The interface control layer may have a thickness of about 2 nm to about 1000 nm, and a ratio of a roughness of the interface control layer to the roughness of the buffer layer may be about 3 or less.

The interface control layer may include $Al_xIn_yGa_{1-x-y}N$ ($0 \le x \le 1$, $0 \le y \le 1$, $x+y < 1$).

The method may further include forming the nitride semiconductor layer that has a plurality of nitride semiconductor layers. At least one mask layer may be between the plurality of nitride semiconductor layers. At least one interlayer that compensates for a tensile stress may be formed between the plurality of nitride semiconductor layers on the at least one mask layer.

The at least one mask layer may include a silicon nitride or a titanium nitride.

The at least one mask layer may include one selected from $Al_{x0}In_{y0}Ga_{1-x0-y0}N$ ($0 \leq x0$, $y0 \leq 1$, $x0+y0 \leq 1$), step-grade $Al_xIn_yGa_{1-x-y}N$ ($0 \leq x$, $y \leq 1$, $x+y \leq 1$), and $Al_{x1}In_{y1}Ga_{1-x1-y1}N/Al_{x2}In_{y2}Ga_{1-x2-y2}N$ ($0 \leq x1$, $x2$, $y1$, $y2 \leq 1$, $x1 \neq x2$ or $y1 \neq y2$) superlattices. The at least one mask layer may be formed to apply a compressive stress to the nitride semiconductor layer thereon.

The nitride semiconductor layer may include a first-type semiconductor layer, an active layer, and a second-type semiconductor layer.

The method may further include removing the silicon substrate.

At least a portion of the buffer layer may be removed together with the removing of the silicon substrate.

The method may further include attaching a support substrate onto the second-type semiconductor layer before the removing of the silicon substrate.

The support substrate may be a silicon substrate on both surfaces of which a bonding metal layer and a back metal layer are formed respectively.

The method may further include, before the removing of the silicon substrate, forming an electrode structure including a first electrode contacting the first-type semiconductor layer and a second electrode contacting the second-type semiconductor layer, so as to inject a current into the active layer.

The method may further include attaching a support substrate, which is connected electrically to at least one of the first electrode and the second electrode, onto the second-type semiconductor layer.

The support substrate may be a silicon substrate.

The method may further include forming a wavelength conversion layer, which converts a wavelength of light that is generated by and emitted from the active layer, on the second-type semiconductor layer.

A metal layer patterned into two portions for exposing the first electrode and the second electrode respectively may be formed on one surface of the support substrate.

The method may further include forming a passivation layer that surround an upper portion and a side portion of the second-type semiconductor layer.

The passivation layer may be formed to adjust a viewing angle of light that is generated by and emitted from the active layer.

BRIEF DESCRIPTION OF THE DRAWINGS

The foregoing and other features of the present inventive concept will be apparent from more particular description of embodiments of the present inventive concept, as illustrated in the accompanying drawings in which like reference characters may refer to the same or similar parts throughout the different views. The drawings are not necessarily to scale, emphasis instead being placed upon illustrating the principles of the embodiments of the present inventive concept.

DETAILED DESCRIPTION OF THE EMBODIMENTS

Figure 1:
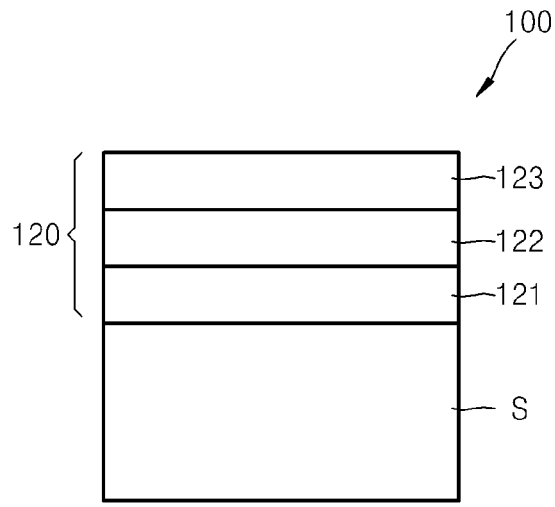
FIG. 1 is a schematic cross-sectional view of a semiconductor buffer structure according to an embodiment of the present inventive concept.

Hereinafter, a semiconductor buffer structure and a semiconductor device including the semiconductor buffer structure will be described with regard to exemplary embodiments of the present inventive concept with reference to the attached drawings. In the drawings, like reference numerals in the drawings denote like elements, and the thicknesses of layers and regions are exaggerated for clarity. Embodiments of the present inventive concept are just examples and the present inventive concept may be embodied in many different forms. Hereinafter, it will also be understood that when a layer is referred to as being "on" another layer or substrate, it may be directly on the other layer or substrate, or intervening layers may also be present.

As used herein, the term "and/or" includes any and all combinations of one or more of the associated listed items. Expressions such as "at least one of," when preceding a list of elements, modify the entire list of elements and do not modify the individual elements of the list.

FIG. 1 is a schematic cross-sectional view of a semiconductor buffer structure 100 according to an embodiment of the present inventive concept.

The semiconductor buffer structure 100 may include a silicon substrate S and a buffer layer 120 formed on the silicon substrate S.

The silicon substrate S may be a substrate having a Si (111) crystalline surface.

The buffer layer 120 may be used as a stress compensation layer for growing an excellent nitride semiconductor having few cracks or defects, may be formed by alternately disposing a plurality of layers having different lattice constant distributions, and may be configured to apply compressive stress to a target layer to be formed on the buffer layer 120, as a whole. To this end, the buffer layer 120 may include a plurality of layers formed of $Al_xIn_yGa_{1-x-y}N$ ($0 \le x \le 1, 0 \le y \le 1, 0 \le x+y \le 1$) of which a composition ratio is determined such that the layers may obtain required lattice constants, respectively.

Hereinafter, the term 'lattice constant' refers to a constant or a lattice constant distribution. In addition, when the term 'lattice constant' is used for an element including a plurality of layers or an element having a lattice constant distribution instead of a constant, the term 'lattice constant' refers to a lattice constant average in the element. In addition, the lattice constant is used to compare differences in general lattice constants provided by layers (when lattice relaxation does not occur in the layers), and does not refer to an actual lattice constant caused by lattice relaxation in a stack structure of, for example, AlN 3.11 Å/GaN 3.191 Å.

According to the present embodiment, the buffer layer 120 may include a first layer 121, a second layer 122, and a third layer 123. The first layer 121 may include $Al_xIn_yGa_{1-x-y}N$ ($0 \le x \le 1, 0 \le y \le 1, 0 \le x+y \le 1$) and have a lattice constant LP1 that is smaller than a lattice constant LP0 of the silicon substrate S. The second layer 122 may be formed on the first layer 121, include $Al_xIn_yGa_{1-x-y}N$ ($0 \le x < 1, 0 \le y < 1, 0 \le x+y < 1$), and have a lattice constant LP2 that is greater than LP1 and is smaller than LP0. The third layer 123 may be formed on the second layer 122, include $Al_xIn_yGa_{1-x-y}N$ ($0 \le x < 1, 0 \le y < 1, 0 \le x+y < 1$), and have a lattice constant LP3 that is smaller than LP2. LP3 may be greater than LP1.

The first layer 121 may have a lattice constant that is smaller than the lattice constant of the silicon substrate S, and thus, may undergo tensile stress. The second layer 122 may have a lattice constant that is greater than the lattice constant of the first layer 121, and thus, may undergo compressive stress due to the first layer 121. The third layer 123 may have a lattice constant that is smaller than the lattice constant of the second layer 122, and thus, may undergo tensile stress due to the second layer 122. The types and strengths of stress applied to layers may vary according to a relationship between layer thicknesses and lattice relaxation in addition to a lattice constant difference with a lower layer. For example, when the second layer 122, which undergoes compressive stress caused by the first layer 121 having lattice relaxation on a silicon substrate, is very thin, lattice relaxation may not occur. When the second layer 122 is grown coherently with a lattice of the first layer 121, that is, when the second layer 122 is grown such that the size of the lattice of the second layer 122 is nearly similarly to the lattice size of the first layer 121, the type and strength of stress undergone by the third layer 123 may depend on the lattice size of the first layer 121. According to this relation, for example, when the first layer 121 or the third layer 123 is a layer that undergoes tensile stress due to the substrate and the second layer 122, if the tensile stress is excessive, cracks may occur. Thus, the first layer 121 or the third layer 123 may be configured to have a thickness that is equal to or smaller than a critical thickness at which cracks occur during growth or cooling of the first layer 121 or the third layer 123.

In addition, the first layer 121 may be configured to directly contact the silicon substrate S and may be formed of AlN.

The first layer 121 may undergo tensile stress due to the silicon substrate S and may have lattice relaxation.

Thicknesses and lattice constants of layers included in the buffer layer 120 may be determined such that the sum of stresses of the layers included in the buffer layer 120 may be compressive stress, that is, such that compressive stress may be applied to a target layer formed on the buffer layer 120.

FIGS. 2A through 2D are example structures that may be employed as individual layers included in a buffer layer 120 of the semiconductor buffer structure 100 of FIG. 1, according to embodiments of the present inventive concept.

Figure 2A:
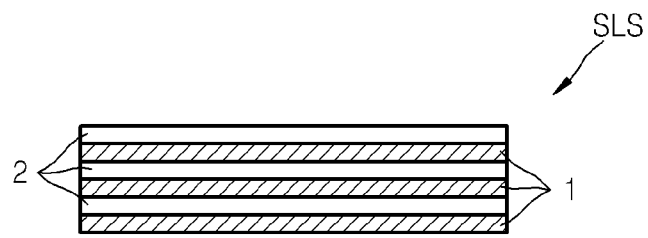
FIGS. 2A through 2D are example structures that may be employed as individual layers included in a buffer layer of the semiconductor buffer structure of FIG. 1, according to embodiments of the present inventive concept.
Figure 2B:
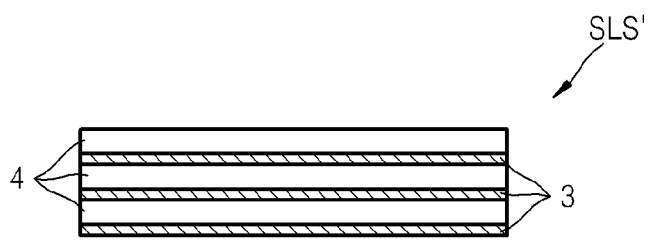

FIGS. 2A and 2B show examples of superlattice structure layers SLS and SLS' that may be used in at least one of a plurality of layers included in the buffer layer 120.

The superlattice structure layer SLS of FIG. 2A is a structure for obtaining a corresponding lattice constant, that is, a structure that satisfies a lattice constant condition of at least one of a plurality of layers included in the buffer layer 120 and is obtained by alternately stacking two layers 1 and 2 having different lattice constants. The two layers 1 and 2 having different lattice constants may have the same thickness. The two layers 1 and 2 may include $Al_xIn_yGa_{1-x-y}N$ ($0 \le x \le 1, 0 \le y \le 1, 0 \le x+y \le 1$) and 'x' and 'y' in the two layers 1 and 2 may be determined according to a required lattice constant.

The superlattice structure layer SLS' of FIG. 2B is a structure for obtaining a corresponding lattice constant, that is, a structure that satisfies a lattice constant condition of at least one of a plurality of layers included in the buffer layer 120 and is obtained by alternately stacking two layers 3 and 4 having different lattice constants. The two layers 3 and 4 having different lattice constants may have different thicknesses. The two layers 3 and 4 may include $Al_xIn_yGa_{1-x-y}N$ ($0 \le x \le 1$, $0 \le y \le 1$, $0 \le x+y \le 1$) and 'x' and 'y' in the two layers 3 and 4 may be determined according to a required lattice constant.

Figure 2C:
Figure 2D:
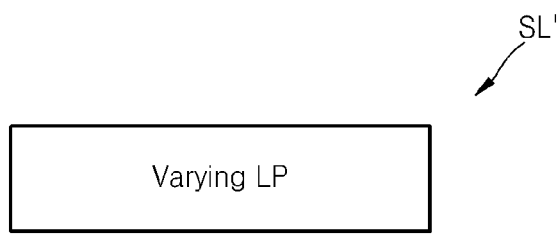

FIGS. 2C and 2D show a case where a required lattice constant, that is, a lattice constant condition for any one of a plurality of layers included in the buffer layer 120 is obtained by a single layer SL or SL'. In this case, the single layer refers to a single layer in which no physical boundary exists but does not necessarily mean that material composition therein is constant.

The single layer SL of FIG. 2C has a lattice constant that does not vary in a thickness direction of the single layer SL. The single layer SL' of FIG. 2D has a lattice constant that varies in a thickness direction of the single layer SL'.

The buffer layer 120 of the semiconductor buffer structure 100 of FIG. 1 may have a three-layered structure that is just an example. For example, the structure may be modified to a structure in which layers satisfying the above lattice constant relationship are further alternately stacked.

Figure 3:
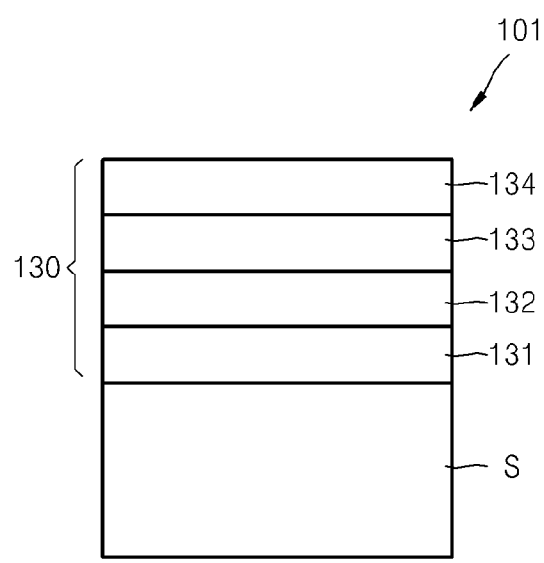
FIG. 3 is a schematic cross-sectional view of a semiconductor buffer structure according to another embodiment of the present inventive concept.

FIG. 3 is a schematic cross-sectional view of a semiconductor buffer structure 101 according to another embodiment of the present inventive concept.

A buffer layer 130 of the semiconductor buffer structure 101 of FIG. 3 may include a first layer 131, a second layer 132, and a third layer 133, which are substantially the same as the first layer 121, the second layer 122, and the third layer 123 of FIG. 1, respectively, and further include a fourth layer 134. The fourth layer 134 may be formed on the third layer 133, include AlxInyGa1−x−yN ($0 \le x<1$, $0 \le y<1$, $0 \le x+y<1$), and have a lattice constant LP4 that is greater than a lattice constant LP2.

Figure 4:
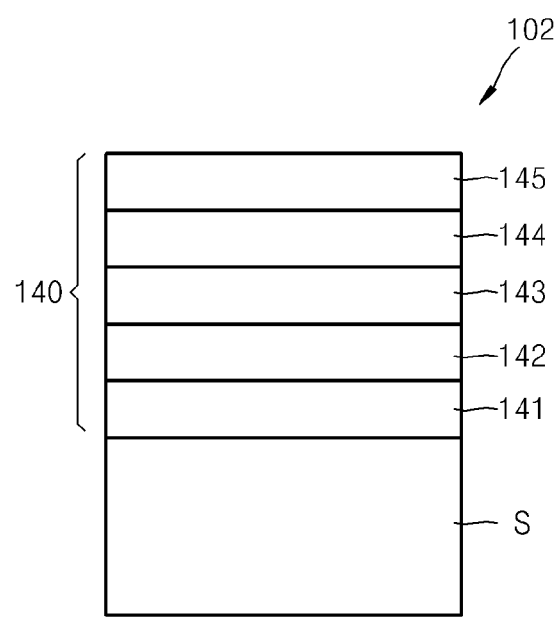
FIG. 4 is a schematic cross-sectional view of a semiconductor buffer structure according to another embodiment of the present inventive concept.

FIG. 4 is a schematic cross-sectional view of a semiconductor buffer structure 102 according to another embodiment of the present inventive concept.

A buffer layer 140 of the semiconductor buffer structure 102 of FIG. 4 may include a first layer 141, a second layer 142, and a third layer 143, which are substantially the same as the first layer 121, the second layer 122, and the third layer 123 of FIG. 1, respectively, and further include a fourth layer 144 and a fifth layer 145. The fourth layer 144 may be formed on the third layer 143, include AlxInyGa1−x−yN ($0 \le x<1$, $0 \le y<1$, $0 \le x+y<1$), and have a lattice constant LP4 that is greater than a lattice constant LP2. The fifth layer 145 may be formed on the fourth layer 144, include $Al_xIn_yGa_{1-x-y}N$ ($0 \le x<1$, $0 \le y<1$, $0 \le x+y<1$), and have a lattice constant LP5 that is greater than a lattice constant LP3 that is smaller than the lattice constant LP4.

Figure 5:
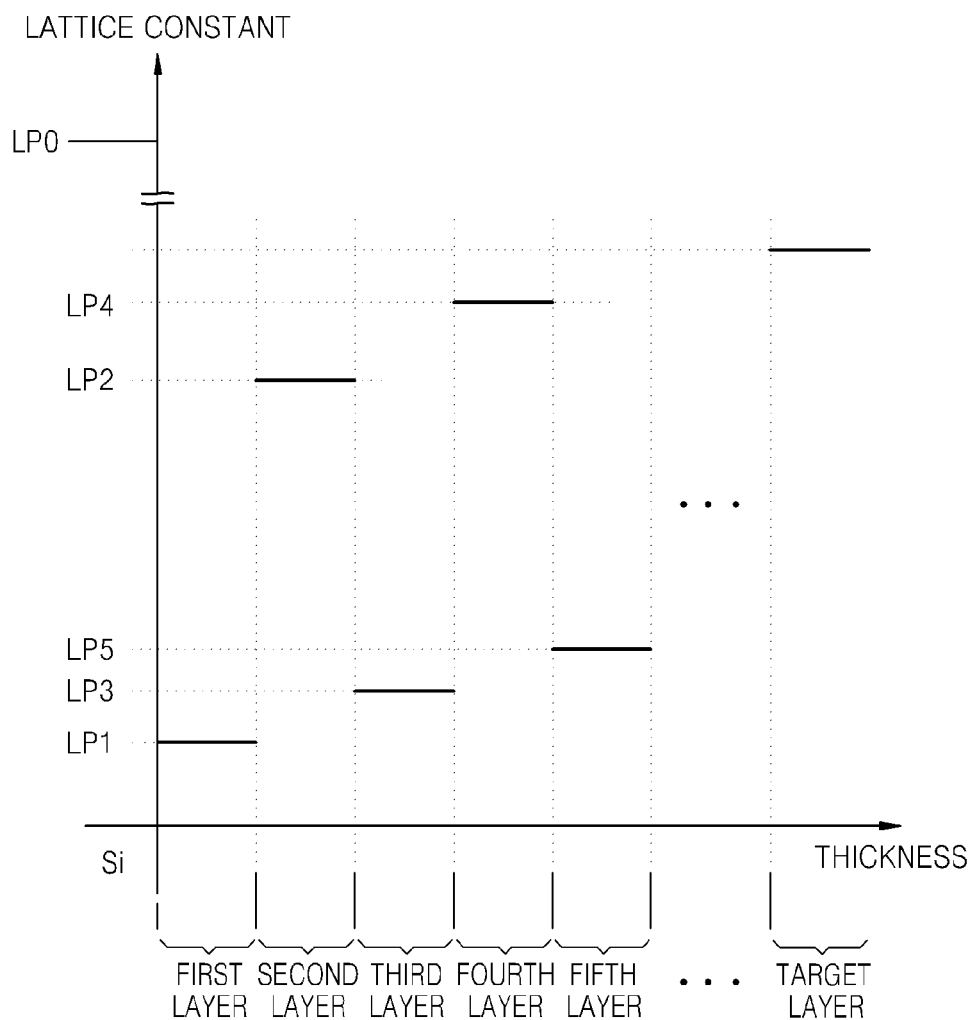
FIG. 5 is a graph of a lattice constant relationship between layers included in the buffer layer of the semiconductor buffer structure of FIG. 1, 3, or 4.

FIG. 5 is a graph of a lattice constant relationship between layers included in the buffer layer 120, 130, or 140 of the semiconductor buffer structure 100, 101, or 102 of FIG. 1, 3, or 4.

The buffer layer 120, 130, or 140 may include a plurality of layers that satisfy the lattice constant relationship shown in FIG. 5 and may include five layers or less, or five layers or more. The uppermost layer of the buffer layer 120, 130, or 140 may have a lattice constant that is smaller than that of a desired target layer, for example, a nitride semiconductor layer.

Each layer of the buffer layer 120, 130, or 140 may have the structure shown in FIGS. 2A through 2D.

Figure 6:
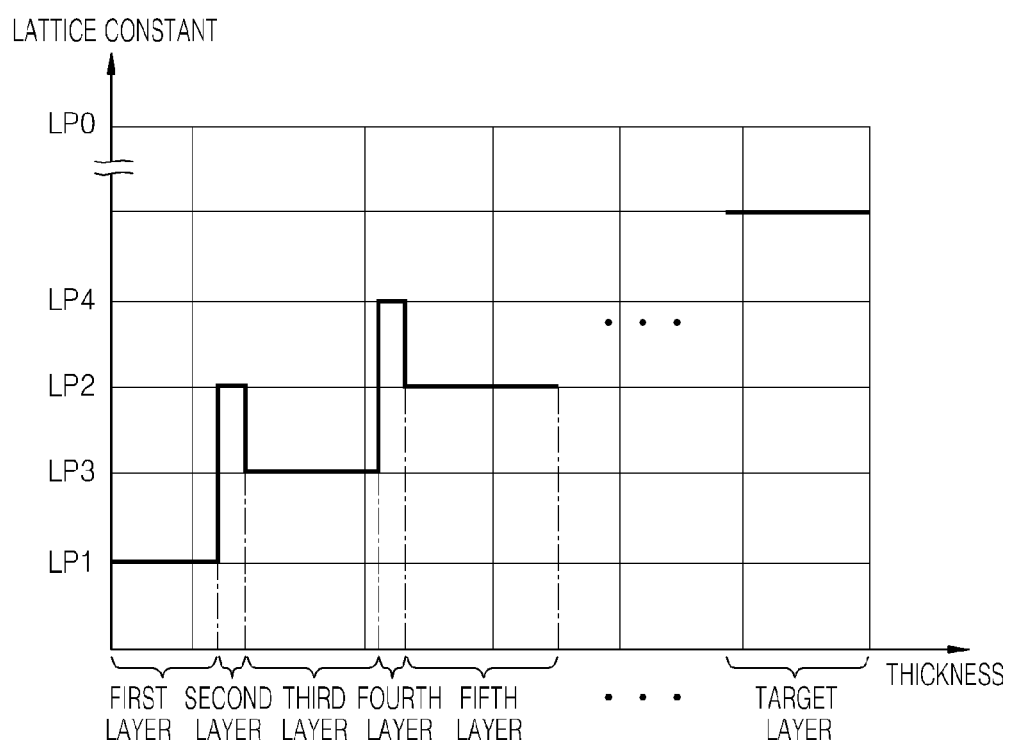
FIG. 6 is a graph of combinations of thicknesses and lattice constants of layers included in the buffer layer of the semiconductor buffer structure of FIG. 1, 3, or 4.
Figure 7:
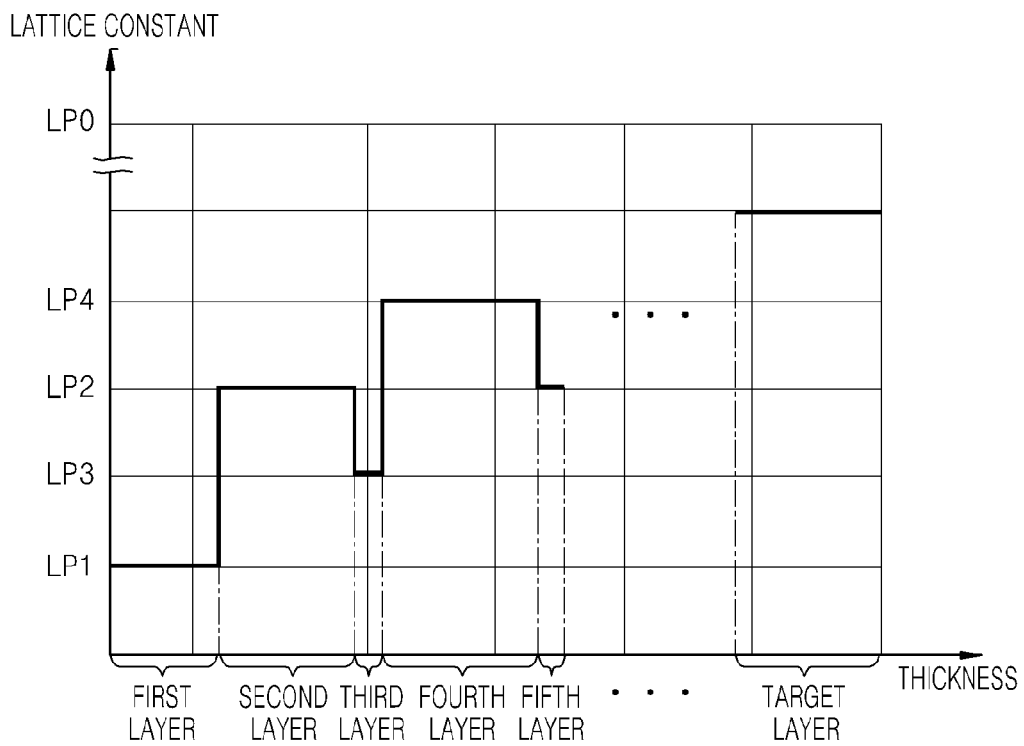
FIG. 7 is another graph of combinations of thicknesses and lattice constants of layers included in the buffer layer of the semiconductor buffer structure of FIG. 1, 3, or 4.

FIGS. 6 and 7 are graphs of combinations of thicknesses and lattice constants of layers included in the buffer layer 120, 130, or 140 of the semiconductor buffer structure 100, 101, or 102 of FIG. 1, 3, or 4.

Referring to FIG. 6, a second layer and a fourth layer may have the same thickness, a third layer and a fifth layer may have the same thickness, and the thickness of the third layer may be greater than the thickness of the second layer. Under this thickness distribution, tensile stress is not applied to the third layer and the fifth layer, which have smaller lattice constants than their lower layers, e.g., the second layer and the fourth layer, respectively. The thickness of a lower layer having a great lattice constant, that is, the second layer or the fourth layer may be small such that tensile stress is not applied to an upper layer having a small lattice constant, that is, the third layer or the fourth layer. In this case, since the upper layer having a small lattice constant is not likely to crack due to tensile stress, the thickness of an upper layer may be greater than a lower layer.

Referring to FIG. 7, the second layer and the fourth layer may have the same thickness, the third layer and the fifth layer may the same thickness, and the thickness of the third layer may be smaller than the thickness of the second layer. Under this thickness distribution, a lower layer having a great lattice constant may have a thickness such that tensile stress is applied to an upper layer having a small lattice constant. The third layer and the fifth layer, which undergo tensile stress, may each have a small thickness so as not to crack during growth or cooling of the third layer and the fifth layer in a manufacturing process.

The examples of FIGS. 6 and 7 show that the type and strength of stress applied to each layer may vary according to thickness and lattice relaxation in addition to a difference in lattice constants determined by compositions.

Figure 8:
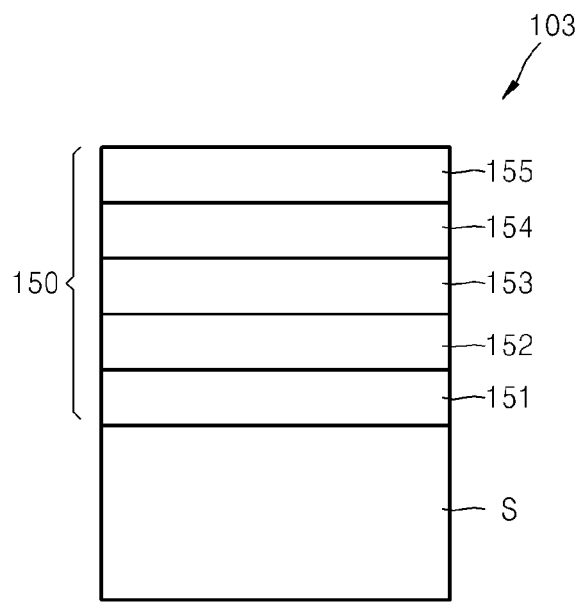
FIG. 8 is a schematic cross-sectional view of a semiconductor buffer structure according to another embodiment of the present inventive concept.
Figure 9:
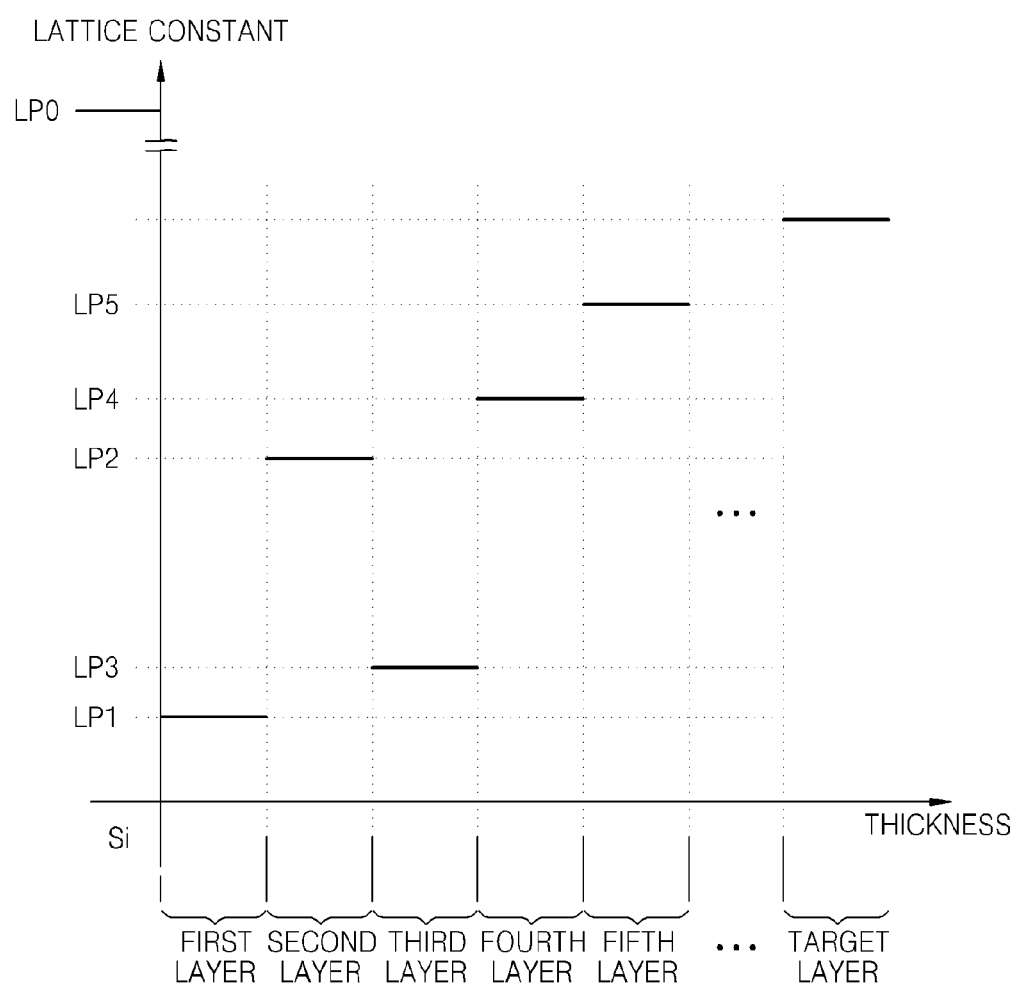
FIG. 9 is a graph of a lattice constant relationship between layers included in a buffer layer of the semiconductor buffer structure of FIG. 8.

FIG. 8 is a schematic cross-sectional view of a semiconductor buffer structure 103 according to another embodiment of the present inventive concept. FIG. 9 is a graph of a lattice constant relationship between layers included in a buffer layer 150 of the semiconductor buffer structure 103 of FIG. 8.

The buffer layer 150 of the semiconductor buffer structure 103 may include a first layer 151, a second layer 152, and a third layer 153, which are substantially the same as the first layer 121, the second layer 122, and the third layer 123 of FIG. 1, respectively, and further include a fourth layer 154 and a fifth layer 155. The fourth layer 154 and fifth layer 155 may be formed on the third layer 153, include $Al_xIn_yGa_{1-x-y}N$ ($0 \le x<1$, $0 \le y<1$, $0 \le x+y<1$), and have lattice constants LP4 and LP5 which are each greater than a lattice constant LP3.

According to the present embodiment, as shown in FIG. 9, the lattice constant relationship is obtained by modifying the lattice constant relationship shown in FIG. 5. The semiconductor buffer structure 103 is a structure including a plurality of layers, which is configured such that a lattice constant continually increases after the third layer 153. That is, for example, the lattice constant LP5 may be greater than the lattice constant LP4. An uppermost layer of the buffer layer 150 may have a smaller lattice constant than that of a target layer. Each layer of the buffer layer 150 may have the structure shown in FIGS. 2A through 2D.

Figure 10:
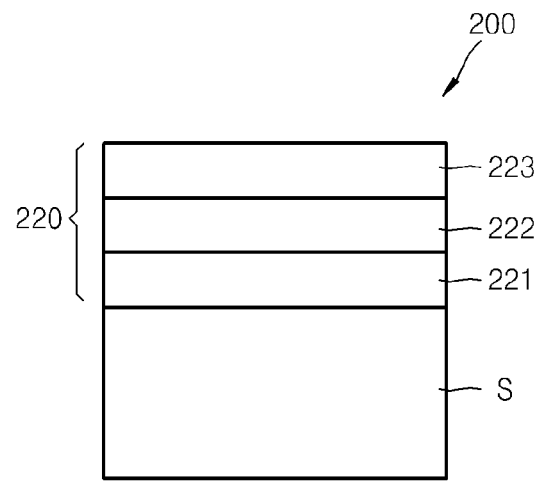
FIG. 10 is a schematic cross-sectional view of a semiconductor buffer structure according to another embodiment of the present inventive concept.

FIG. 10 is a schematic cross-sectional view of a semiconductor buffer structure 200 according to another embodiment of the present inventive concept.

Referring to FIG. 10, the semiconductor buffer structure 200 may include a silicon substrate S, and a buffer layer 220 including a first layer 221, a second layer 222, and a third layer 223, which are sequentially formed on the silicon substrate S. The first layer 221 may include $Al_xIn_yGa_{1-x-y}N$ ($0 \leq x \leq 1$, $0 \leq y \leq 1$, $0 \leq x+y \leq 1$) and have a lattice constant LP1 that is smaller than a lattice constant LP0 of the silicon substrate S. The second layer 222 may be formed on the first layer 221, includes $Al_xIn_yGa_{1-x-y}N$ ($0 \leq x \leq 1$, $0 \leq y \leq 1$, $0 \leq x+y \leq 1$), and have a lattice constant distribution that increases in a thickness direction. The third layer 223 may be formed on the second layer 222, include $Al_xIn_yGa_{1-x-y}N$ ($0 \leq x \leq 1$, $0 \leq y \leq 1$, $0 \leq x+y \leq 1$), and have a smaller lattice constant than that of the second layer 222.

Figure 11:
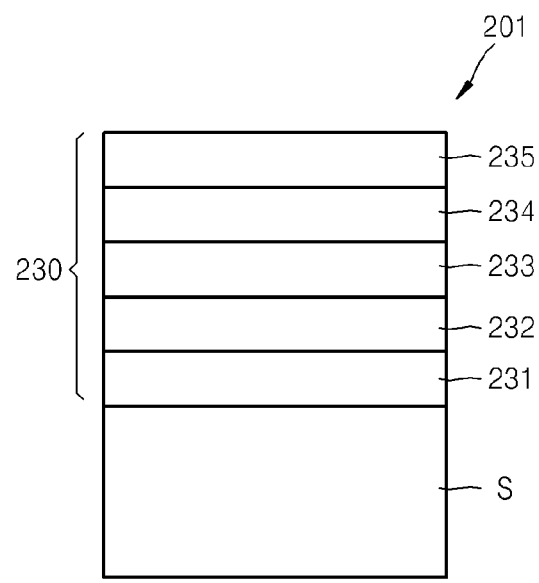
FIG. 11 is a schematic cross-sectional view of a semiconductor buffer structure according to another embodiment of the present inventive concept.

FIG. 11 is a schematic cross-sectional view of a semiconductor buffer structure 201 according to another embodiment of the present inventive concept.

A buffer layer 230 of the semiconductor buffer structure 201 of FIG. 11 may include a first layer 231, a second layer 232, and a third layer 233, which are substantially the same as the first layer 221, the second layer 222, and the third layer 223 of FIG. 10, respectively, and further include a fourth layer 234. The fourth layer 234 may be formed on the third layer 233, include $Al_xIn_yGa_{1-x-y}N$ ($0 \leq x \leq 1$, $0 \leq y \leq 1$, $0 \leq x+y \leq 1$), and have a lattice constant distribution that increases in a thickness direction. In addition, the buffer layer 230 may further include a fifth layer 235. The fifth layer 235 may be formed on the fourth layer 234, include $Al_xIn_yGa_{1-x-y}N$ ($0 \leq x < 1$, $0 \leq y < 1$, $0 \leq x+y < 1$), and have a smaller lattice constant than a lattice constant average of the fourth layer 234.

In FIG. 11, the fourth layer 234 and the fifth layer 235 may be stacked on the third layer 233 once. However, the fourth layer 234 and the fifth layer 235 may be alternately stacked on the third layer 233 one or more times.

The lattice constant average of the fourth layer 234 may be equal to or greater than a lattice constant average of the second layer 232. In addition, a lattice constant of the fifth layer 235 may be equal to or more than that of the third layer 233.

Figure 12:
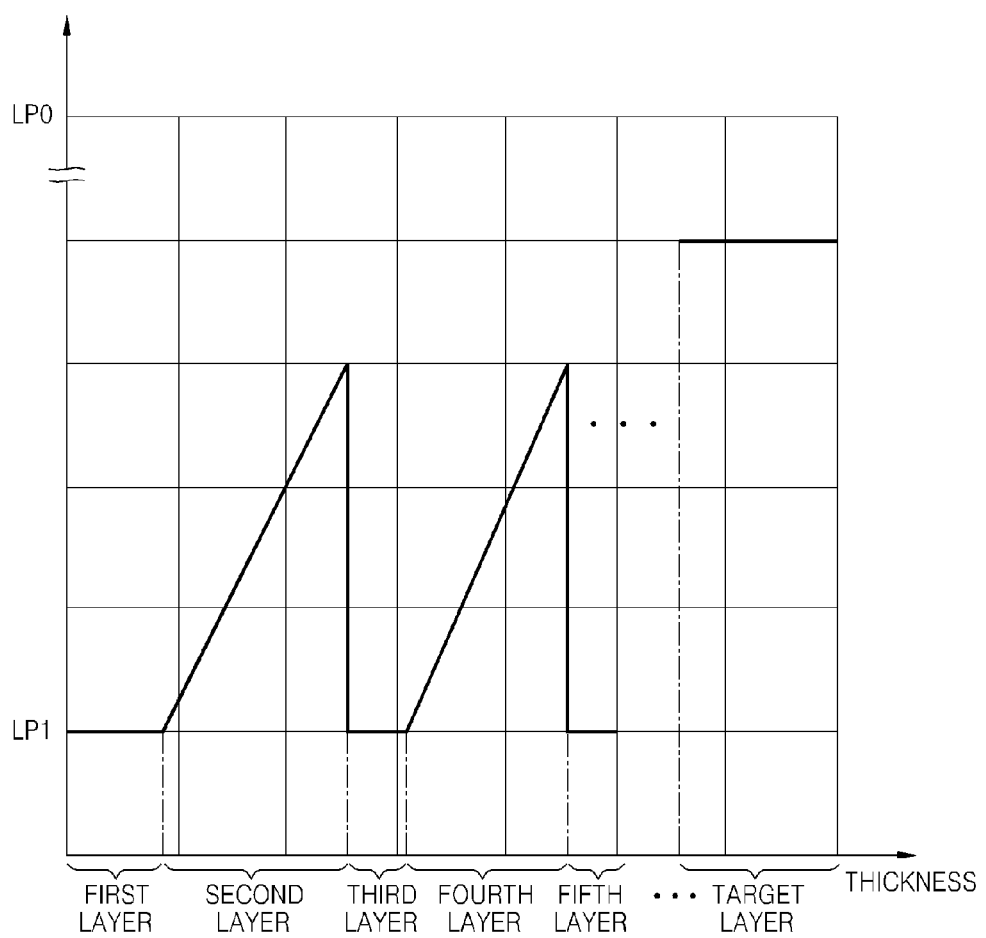
FIGS. 12 through 14 are graphs of combinations of thicknesses and lattice constants of layers included in the buffer layer of the semiconductor buffer structure of FIG. 10 or 11.
Figure 13:
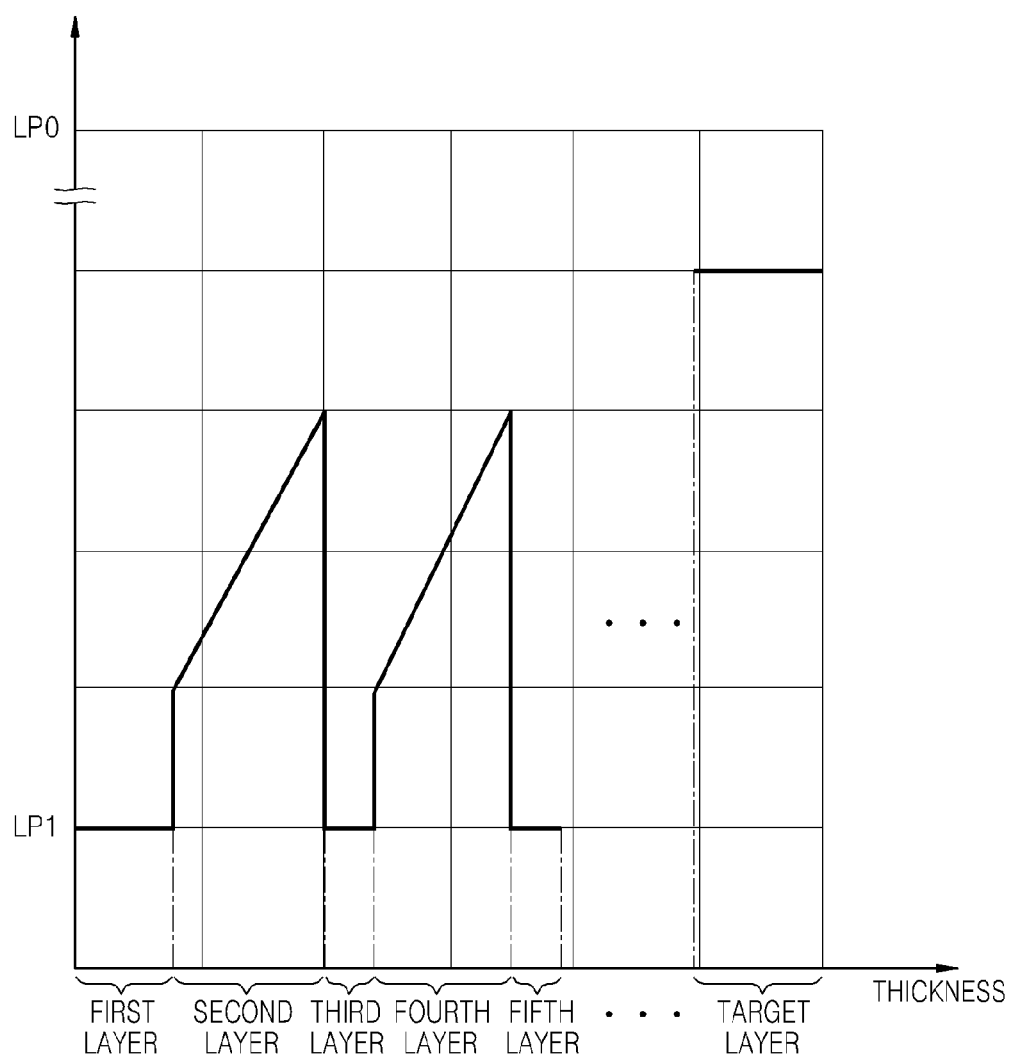
Figure 14:
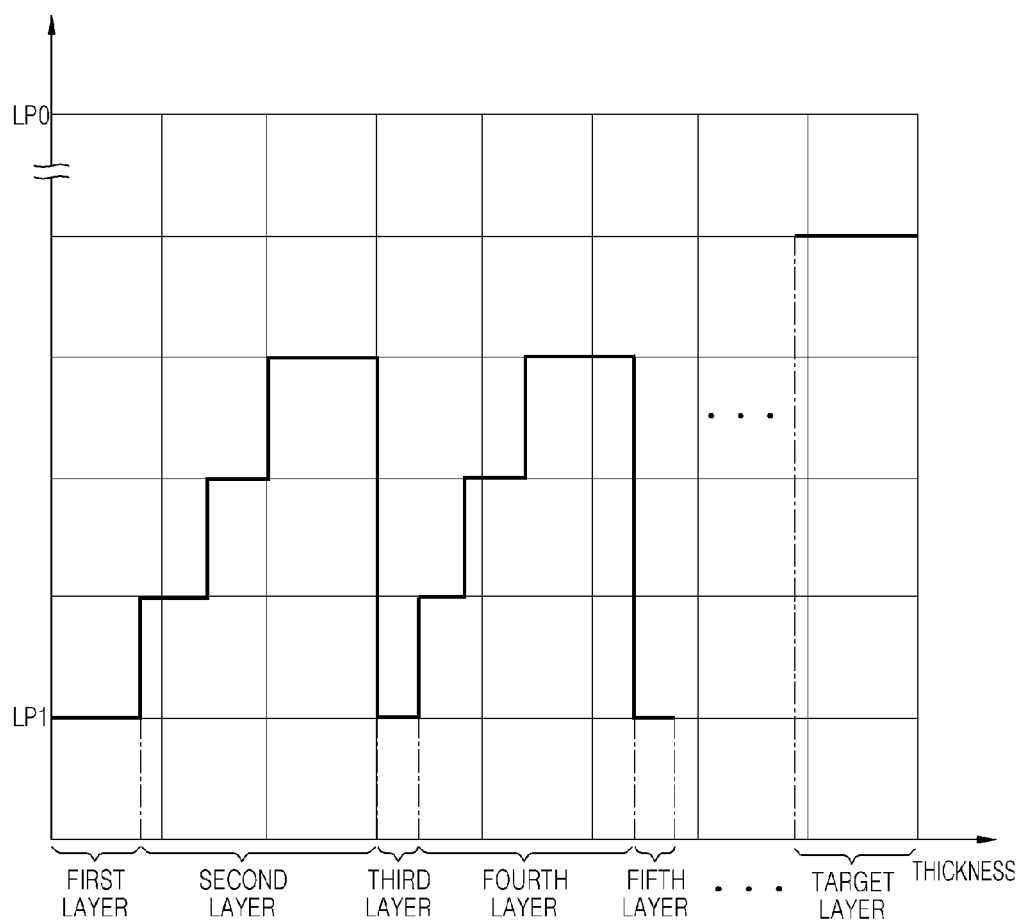

FIGS. 12 through 14 are graphs of combinations of thicknesses and lattice constants of layers included in the buffer layer 220 or 230 of the semiconductor buffer structure 200 or 201 of FIG. 10 or 11.

Referring to FIGS. 12 and 13, a lattice constant distribution of the second layer and the fourth layer may increase continuously and may increase linearly as illustrated. As shown in FIG. 12, a minimum value of a lattice constant in the lattice constant distribution of the second layer and the fourth layer may be the same as a lattice constant of the first layer. Alternatively, as shown in FIG. 13, the minimum value of the lattice constant in the lattice constant distribution of the second layer and the fourth layer may be greater than the lattice constant of the first layer.

FIGS. 12 and 13 show the case where the lattice constant of the third layer is the same as the lattice constant of the first layer. However, this is just an example. That is, the lattice constant of the third layer may be greater than the lattice constant of the first layer. In addition, FIGS. 12 and 13 show the case where the lattice constant of the fifth layer is the same as the lattice constant of the third layer. However, this is just an example. That is, the lattice constant of the fifth layer may be greater than the lattice constant of the third layer.

Referring to FIG. 14, a lattice constant distribution of the second layer and the fourth layer may each increase in a step form. As shown in FIG. 14, the lattice constant of the third layer may be the same as that of the first layer. However, the present inventive concept is not limited thereto. That is, the lattice constant of the third layer may be greater than that of the first layer.

In FIGS. 12 through 14, the thickness of the third layer is smaller than the thickness of the second layer, and since the lattice constant of the second layer is greater than that of the third layer, the third layer is a layer that undergoes tensile stress. The third layer may have a thickness that is equal to or less than a critical thickness so as not to crack due to tensile stress during the manufacture of the semiconductor buffer structure 200 or 201.

FIGS. 12 through 14 show an example where compressive stress is applied to a target layer by using a combination of layers having different lattice constant distributions, which may be changed in various ways from the structure shown in FIGS. 12 and 14. For example, FIGS. 12 through 14 show the case where the second layer and the fourth layer have the same lattice constant distribution shape. However, the present inventive concept is not limited thereto. That is, for example, the second layer and the fourth layer may have lattice constant distributions that linearly increase with different inclinations. As another example, one of the second layer and the fourth layer may have a lattice constant that linearly increases and the other of the second layer and the fourth layer may increase in a step form.

Figure 15:
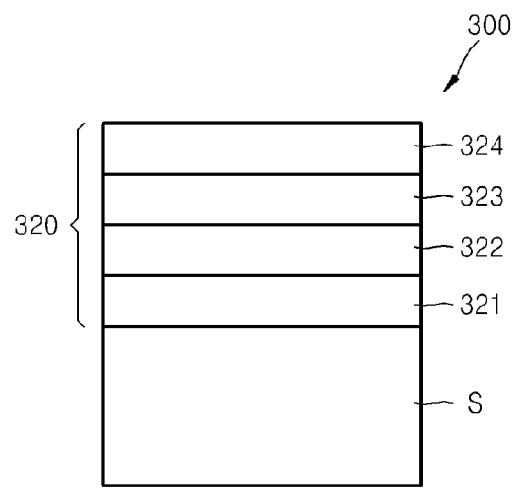
FIG. 15 is a schematic cross-sectional view of a semiconductor buffer structure according to another embodiment of the present inventive concept.
Figure 16A:
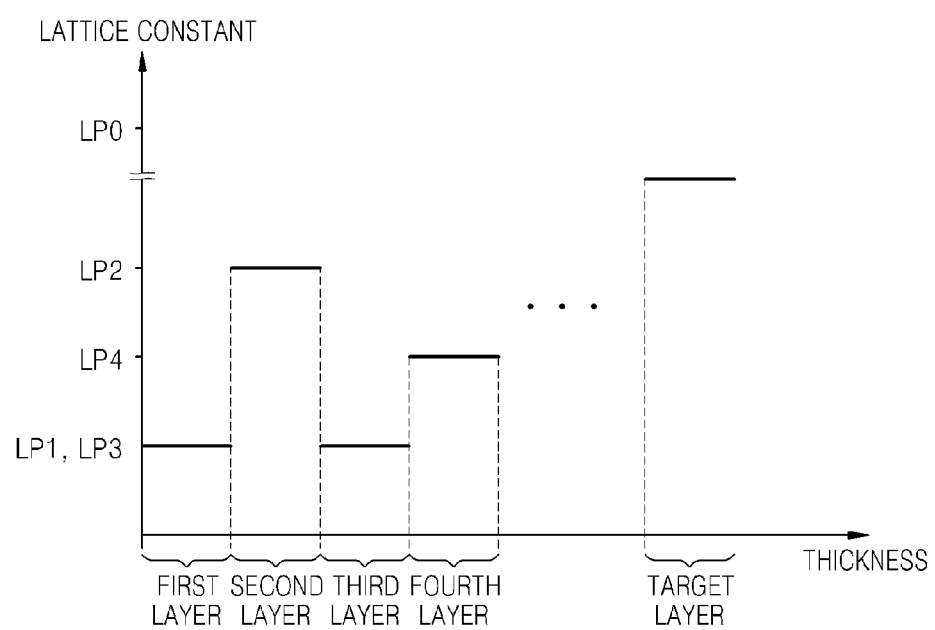
FIGS. 16A and 16B are graphs of a lattice constant relationship between layers included in a buffer layer of the semiconductor buffer structure of FIG. 15.
Figure 16B:
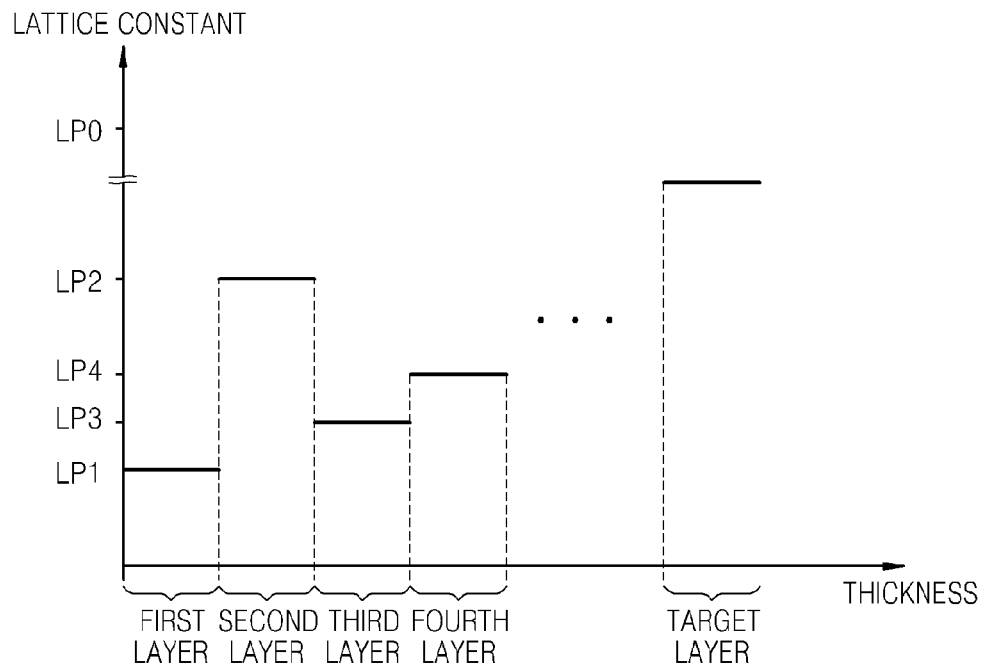

FIG. 15 is a schematic cross-sectional view of a semiconductor buffer structure 300 according to another embodiment of the present inventive concept. FIGS. 16A and 16B are graphs of a lattice constant relationship between layers included in a buffer layer 320 of the semiconductor buffer structure 300 of FIG. 15.

The semiconductor buffer structure 300 may include a silicon substrate S and a buffer layer 320 formed on the silicon substrate S. The buffer layer 320 may includes a first layer 321, a second layer 322, a third layer 323. The first layer 321 may include $Al_xIn_yGa_{1-x-y}N$ ($0 \leq x < 1$, $0 \leq y < 1$, $0 \leq x+y < 1$) and have a lattice constant LP1 that is smaller than a lattice constant LP0 of the silicon substrate S. The second layer 322 may be formed on the first layer 321, include $Al_xIn_yGa_{1-x-y}N$ ($0 \leq x < 1$, $0 \leq y < 1$, $0 \leq x+y < 1$), and have a lattice constant LP2 that is greater than LP1 and smaller than LP0. The third layer 323 may be formed on the second layer 322, include $Al_xIn_yGa_{1-x-y}N$ ($0 \leq x < 1$, $0 \leq y < 1$, $0 \leq x+y < 1$), and have a lattice constant LP3 that is equal to or greater than LP1 and smaller than LP2.

The lattice constant LP3 of the third layer 323 may be equal to the lattice constant LP1 of the first layer 321 as illustrated in FIG. 16A, or may be greater than the lattice constant LP1 of the first layer 321 as illustrated in FIG. 16B.

The third layer 323 may have a thickness such that lattice relaxation occurs. That is, the third layer 323 may have a thickness that is equal to or greater than a critical thickness, such that strain relaxation occurs to a level of its own lattice size, not to a level of the lattice size of the lower layer. The critical thickness may vary according to the compositions of the lower layers, that is, the second layer 322 and the third layer 323. For example, when the composition of the second layer 322 is AlGaN having a composition of Al 30% and the third layer 323 is AlN, strain relaxation of the third layer 323 starts to occur at a thickness of about 10 nm. Since the lattice constant LP3 of the third layer 323 is smaller than the lattice constant LP2 of the second layer 322, the third layer 323 may undergo tensile stress due to the second layer 322. When the tensile stress is excessive, cracks may occur. Thus, the third layer 323 may be configured to have a thickness that is equal to or smaller than a critical thickness at which cracks occur during growth or cooling of the third layer 323.

The buffer layer 320 may further include a fourth layer 324. The fourth layer 324 may be formed on the third layer 323, include $Al_xIn_yGa_{1-x-y}N$ ($0 \leq x < 1$, $0 \leq y < 1$, $0 \leq x+y < 1$), and have a lattice constant LP4 that is greater than LP3. The lattice constant LP4 of the fourth layer 324 may be smaller than LP2 as illustrated in FIGS. 16A and 16B. However, the present inventive concept is not limited thereto. That is, the lattice constant LP4 of the fourth layer 324 may be equal to or greater than LP2.

Figure 17:
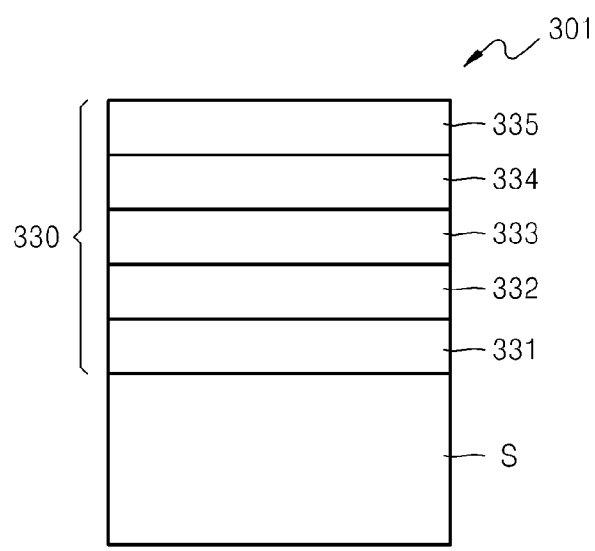
FIG. 17 is a schematic cross-sectional view of a semiconductor buffer structure according to another embodiment of the present inventive concept.
Figure 18A:
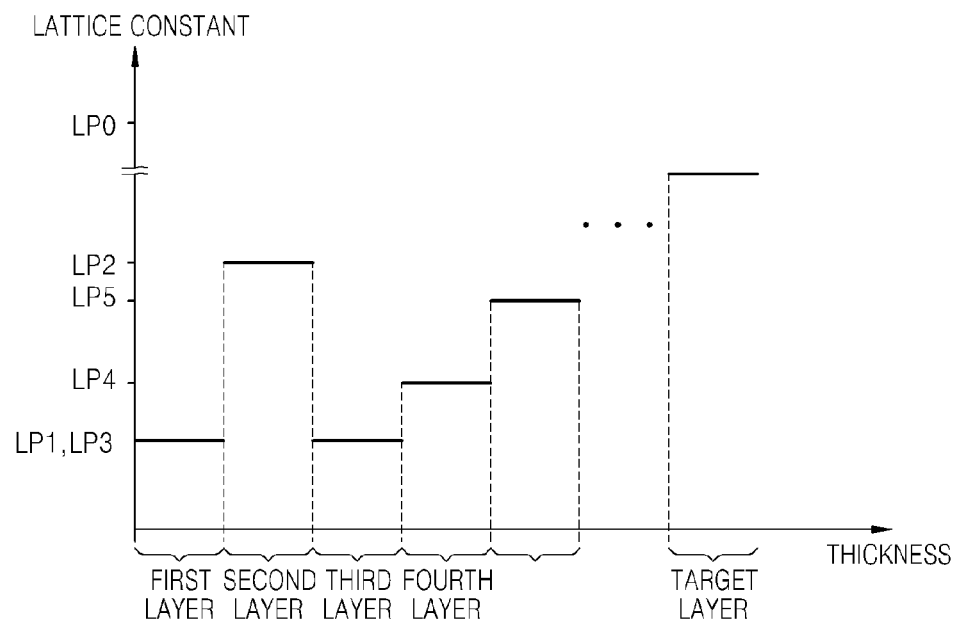
FIGS. 18A and 18B are graphs of a lattice constant relationship between layers included in a buffer layer of the semiconductor buffer structure of FIG. 17.
Figure 18B:
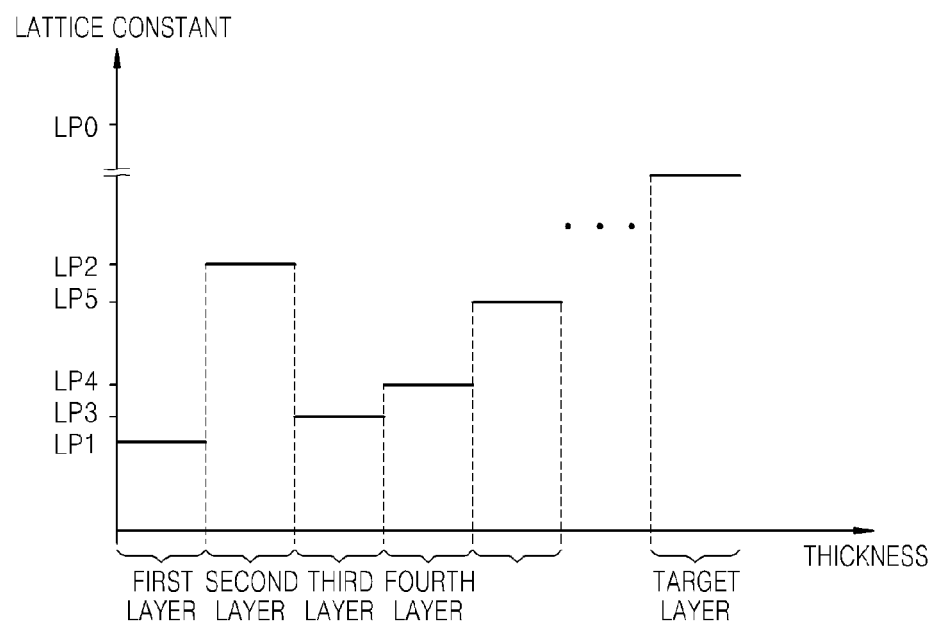

FIG. 17 is a schematic cross-sectional view of a semiconductor buffer structure 301 according to another embodiment of the present inventive concept. FIGS. 18A and 18B are graphs of a lattice constant relationship between layers included in a buffer layer 330 of the semiconductor buffer structure 301 of FIG. 17.

The semiconductor buffer structure 301 may include a silicon substrate S and a buffer layer 330 formed on the silicon substrate S. The buffer layer 330 may include a first layer 331, a second layer 332, and a third layer 333, which are substantially the same as the first layer 321, the second layer 322, and the third layer 323 of FIG. 15, respectively, and further include a plurality of layers that may be formed of a material including $Al_xIn_yGa_{1-x-y}N$ ($0 \leq x < 1$, $0 \leq y < 1$, $0 \leq x+y < 1$) on the third layer 333. The plurality of layers may have lattice constants greater than LP3, and may be arranged in ascending order of lattice constants. The plurality of layers may be two layers that are a fourth layer 334 and a fifth layer 335; however, the present inventive concept is not limited thereto. The lattice constant LP3 of the third layer 333 may be equal to the lattice constant LP1 of the first layer 331 as illustrated in FIG. 18A, or may be greater than the lattice constant LP1 of the first layer 331 as illustrated in FIG. 18B. The fourth layer 334 and the fifth layer 335 are illustrated in FIGS. 18A and 18B, as having lattice constants that are smaller than the lattice constant LP2. However, the present inventive concept is not limited thereto. That is, the fourth layer 334 and the fifth layer 335 may have lattice constants that are equal to or greater than LP2.

The above-described semiconductor buffer structure may be formed by alternately stacking a layer undergoing compressive stress and a layer undergoing tensile stress so as to form compressive stress as a whole, thereby compensating for stress in a target layer formed on the above-described buffer structure.

When a nitride semiconductor thin film is grown on the above-described semiconductor buffer structure, since cracks are prevented from occurring in the nitride semiconductor thin film, a semiconductor device having a large area may be manufactured by using a silicon substrate.

The silicon substrate S used in the above semiconductor buffer structure may be doped with a dopant. For example, the silicon substrate S may be doped with a dopant at a predetermined doping concentration. The dopant may include at least one of boron (B), aluminum (Al), magnesium (Mg), calcium (Ca), zinc (Zn), cadmium (Cd), hydrargyrum (Hg), and gallium (Ga). The doping concentration may be determined such that the silicon substrate S has a resistivity of about 1 Ωcm or less.

The silicon substrate S may be formed by preparing a general silicon substrate (that is, a silicon substrate that is not doped with a dopant or is doped with a dopant at a low doping concentration) and doping the silicon substrate with a dopant by ion implantation.

The use of a heavily-doped silicon substrate is to reduce the warpage of a substrate during a semiconductor device manufacturing process. In general, the amount of warpage is represented by a bow that is measured at a wafer level. Herein, "wafer" collectively refers to a substrate and a thin film formed on the substrate. The bow occurs due to a difference between the thermal expansion coefficients of the substrate and the thin film formed on the substrate. When a wafer W is cooled at normal temperature after a high-temperature process for growing a thin film, a shrinkage may occur differently according to a thermal expansion coefficient difference and thus the wafer W may warp. In this case, a distance between a position, at which the wafer W protrudes most, and a position, at which the wafer W is curved most in the thickness direction of the wafer W, is referred to as a bow. Under the same condition, the bow may increase in proportion to the square of a diameter D of the wafer W. Therefore, a bow may increase as the size of a substrate used increases.

When a general silicon substrate is used, a convex bow of tens of microns to hundreds of microns may be observed after growth of a nitride semiconductor film, which may be analyzed as being caused by plastic deformation of the silicon substrate. In general, since the thermal expansion coefficient of a silicon substrate is smaller than the thermal expansion coefficient of a semiconductor film formed on the silicon substrate, the nitride semiconductor film may shrink more than the silicon substrate, when cooled at normal temperature, and thus a concave bow may occur. In general, a compressive stress of a gigapascal (GPa) level is applied to offset a tensile stress generated at a semiconductor film in a high-temperature growth process. This high temperature and compressive stress may cause plastic deformation of the silicon substrate. That is, the silicon substrate, which is apt to brittle at normal temperature, becomes ductile at high temperature, and in this condition, an excessive stress applied to the silicon substrate may cause plastic deformation of the silicon substrate. In this case, even after the condition of high temperature and stress is removed, the silicon substrate may not return to an original state and thus, may have a bow.

However, when silicon doped at a proper doping concentration is used, the bow may be reduced to, for example, about 100 μm or less for a disk shape with a diameter of 2".

The silicon substrate S used in the above semiconductor buffer structure may be used with a crack prevention portion provided at an edge portion that is vulnerable to a crack that may occur during a semiconductor thin film growth process.

FIGS. 19 through 25 are cross-sectional views illustrating examples of a silicon substrate S that may be employed in a semiconductor buffer structure, according to embodiments of the present inventive concept.

Figure 19:
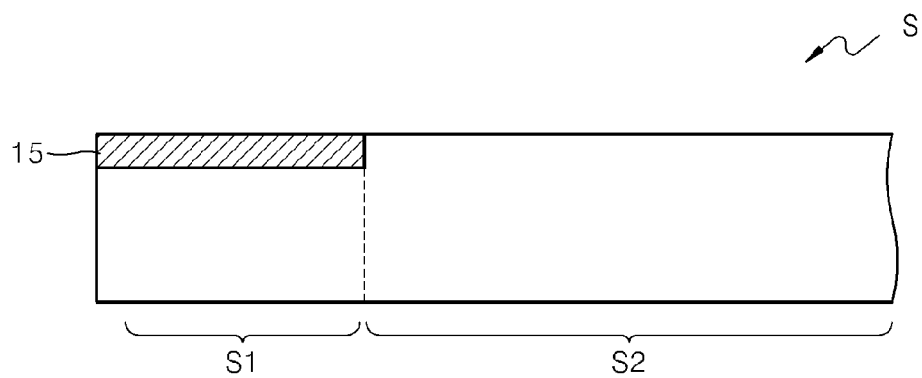
FIGS. 19 through 24 are cross-sectional views illustrating examples of a silicon substrate that may be employed in a semiconductor buffer structure, according to embodiments of the present inventive concept.

Referring to FIG. 19, the silicon substrate S may include a main portion S2 and an edge portion S1 surrounding the main portion S2. The silicon substrate S may be, for example, circular, and the main portion S2 may be a portion of the silicon substrate S inside the edge portion S1. The main portion S2 may be a region in which a monocrystalline nitride semiconductor thin film is to be grown. For example, the silicon substrate S may include a crack prevention portion 15 that is formed with a random crystalline surface direction on a top surface of the edge portion S1.

For example, the main portion S2 may have a (111) crystalline surface, and the crack prevention portion 15 may have a non-uniform crystalline surface. Since the crystalline surface direction of the crack prevention portion is non-uniform, when a nitride semiconductor thin film is formed thereon, the nitride semiconductor thin film may not grow in a monocrystalline structure and may grow in an amorphous of polycrystalline structure. On the other hand, the nitride semiconductor thin film may grow in a monocrystalline structure on the main portion S2.

In the process of growing a nitride semiconductor thin film on the silicon substrate S, when the crack prevention portion 15 has a random crystalline surface direction or a rough surface, the crystalline direction may be oriented, for example, in the (111) direction in the main portion S2, but the crystalline direction may be oriented randomly in the crack prevention portion 15 due to the rough surface of the crack prevention portion. Therefore, since the nitride semiconductor thin film grown on the crack prevention portion 15 are grown in a polycrystalline or amorphous state, a stress at an interface between the substrate and the thin film caused by the growth of heterogeneous materials may be relaxed, unlike a monocrystalline portion of the nitride semiconductor thin film grown on the (111) surface of the silicon substrate. Therefore, when a nitride semiconductor thin film is grown on the edge portion S1, a stress caused by the thin film may be reduced and thus the deformation of the silicon substrate may be relaxed.

Figure 20:
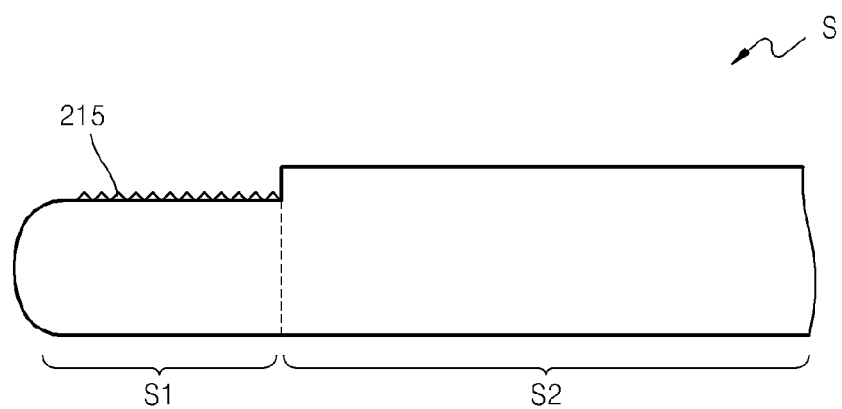

Referring to FIG. 20, the silicon substrate S may include a main portion S2 and an edge portion S1 surrounding the main portion S2, and a crack prevention portion 215 having the shape of an uneven pattern may be formed on the edge portion S1. The uneven pattern may be formed through a general photolithography process, and due to the uneven pattern, the crack prevention portion 215 may have a rough surface or a random crystalline surface direction.

Figure 21:
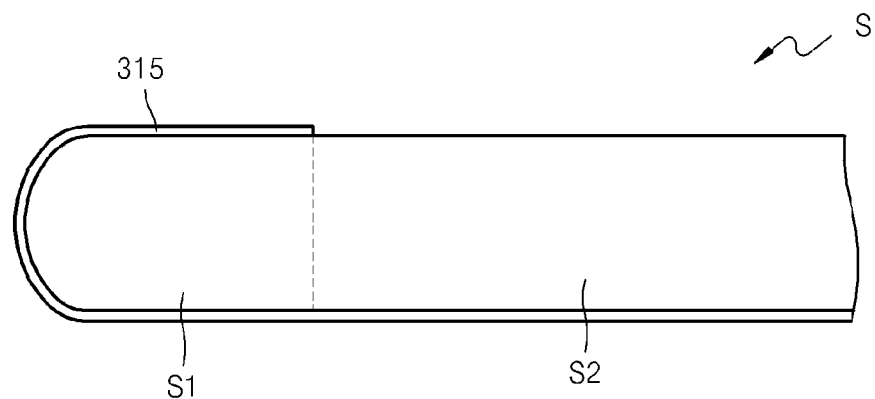

Referring to FIG. 21, the silicon substrate S may include a silicon main portion S2, a silicon edge portion S1 surrounding the silicon main portion S2, and a crack prevention portion 315 formed on the silicon frame portion S1. For example, the crack prevention portion 315 may be formed of a thermal oxide formed by thermal oxidation of the edge portion S1. Alternatively, the crack prevention portion 315 may be formed of a dielectric film by depositing a dielectric material, such as an oxide or a nitride, on the silicon substrate S by sputtering or chemical vapor deposition (CVD) and patterning and etching the resulting structure through a photolithography process. Herein, the crack prevention portion 315 may extend to the side surface or the bottom surface of the silicon substrate S in addition to the top portion of the silicon frame portion S1.

Figure 22:
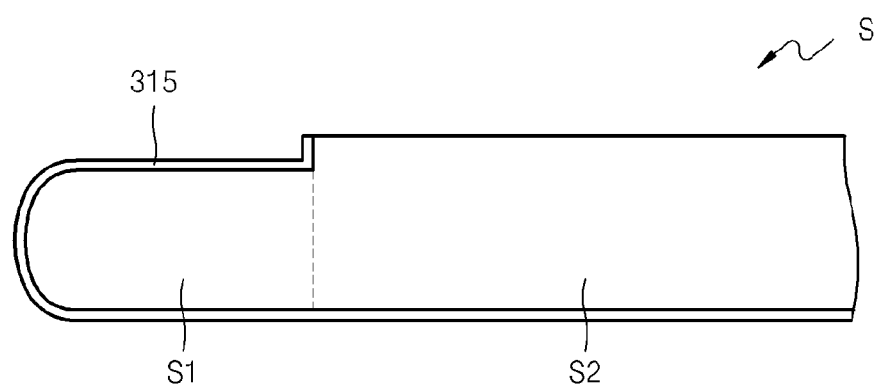

Referring to FIG. 22, in the silicon substrate S, a top portion of the edge portion S1 may be etched to form a step portion, and a crack prevention portion 315 may be formed on the edge portion S1 stepped lower than the main portion S2 of the silicon substrate S.

Figure 23:
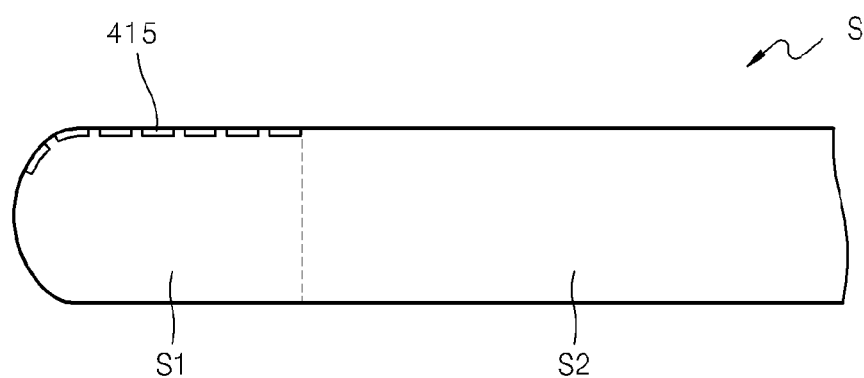

Referring to FIG. 23, the silicon substrate S may include a main portion S2, an edge portion S1 surrounding the main portion S2, and a crack prevention portion 415 formed on the edge portion S1. The crack prevention portion 415 may be formed on the edge portion S1 by ion implantation. By the ion implantation, the surface of the edge portion S1 may be changed into a polycrystalline or amorphous state. FIG. 23 illustrates that ion implantation may be performed only on the top surface of the edge portion S1. However, the present inventive concept is not limited thereto. That is, ion implantation may also be performed on the side surface and the bottom surface of the edge portion S1 and the bottom surface of the main portion S2, in addition to the top surface of the edge portion S1. For example, when the crack prevention portion 415 extends up to the side surface of the edge portion S1, a crack reduction effect may be increased by relaxing an impact due to high-speed rotation when the silicon substrate S is rotated at a high speed in a deposition apparatus.

Figure 24:
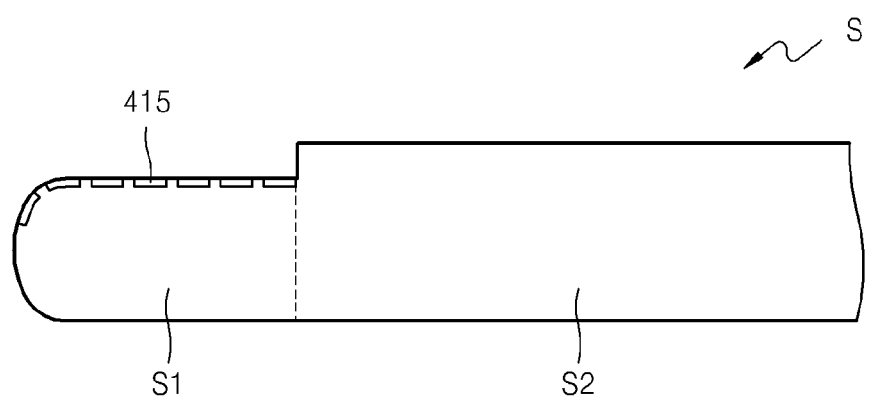

Referring to FIG. 24, in the silicon substrate S, a top portion of the edge portion S1 is etched to form a step portion, and a crack prevention portion 415 may be formed by ion implantation on the edge portion S1 stepped lower than the main portion S2 of the silicon substrate S.

As described above, the silicon substrates S of FIGS. 19 through 24 may be doped at a predetermined doping concentration to reduce a bow that occurs during a semiconductor thin film manufacturing process.

Figure 25:
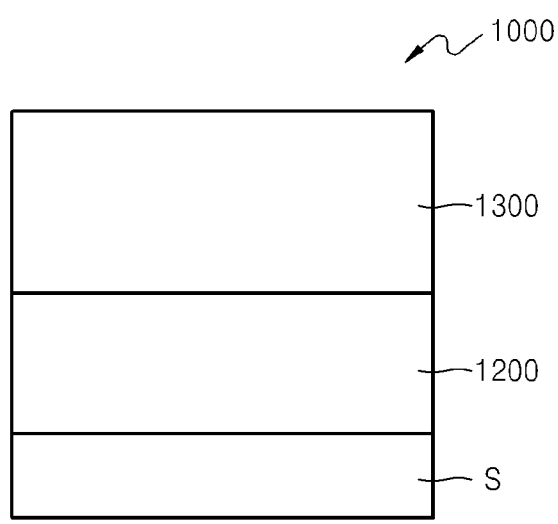
FIG. 25 is a schematic cross-sectional view of a semiconductor device according to an embodiment of the present inventive concept.

FIG. 25 is a schematic cross-sectional view of a semiconductor device 1000 according to an embodiment of the present inventive concept.

The semiconductor device 1000 may include a silicon substrate S, a buffer layer 1200 formed on the silicon substrate S, and a nitride semiconductor layer 1300 formed on the buffer layer 1200.

The semiconductor device 1000 may include the buffer layer 1200 so as to embody the nitride semiconductor layer 1300 having few cracks or defects on the silicon substrate S.

When the nitride semiconductor layer 1300 is grown on the silicon substrate S, the buffer layer 1200 may compensate for tensile stress generated due to a thermal expansion coefficient difference and may be one of the buffer layers 120, 130, 140, 150, 220, 230, 320, and 330 of FIGS. 1 through 17. In addition, a lattice constant of the uppermost layer of the buffer layer 1200 may be smaller than a lattice constant of the nitride semiconductor layer 1300 and may apply compressive stress to the nitride semiconductor layer 1300.

The nitride semiconductor layer 1300 may have a single-layer structure or a multi-layer structure and may include nitride containing gallium (Ga) and $Al_{x1}In_{y1}Ga_{1-x1-y1}N$ ($0 \leq x1$, $y1 \leq 1$, $x1+y1<1$), for example, GaN, InGaN, or AlInGaN. The nitride semiconductor layer 1300 may be selected to be undoped or doped.

The silicon substrate S may be removed during or after manufacture of the semiconductor device 1000.

The semiconductor device 1000 may be used as a template for a light-emitting diode (LED), a Schottky diode, a laser diode (LD), a field effect transistor (FET) or a high electron mobility transistor (HEMT).

Figure 26:
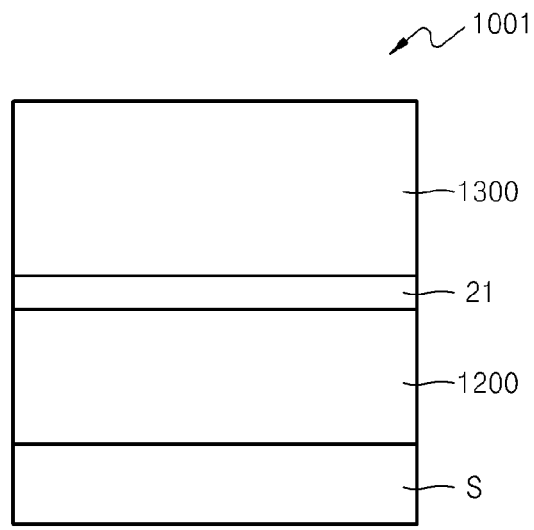
FIG. 26 is a schematic cross-sectional view of a semiconductor device according to another embodiment of the present inventive concept.

FIG. 26 is a schematic cross-sectional view of a semiconductor device 1001 according to another embodiment of the present inventive concept.

The semiconductor device 1001 may include a silicon substrate S, a buffer layer 1200, an interface control layer 21, and a nitride semiconductor layer 1300. The interface control layer 21 may be grown according to a growth condition for controlling a roughness increase rate with respect to the roughness of the buffer layer 1200. The interface control layer 21 may be provided to realize a high quality even without greatly increasing the thickness of the nitride semiconductor layer 1300. Therefore, the semiconductor device 1001 may have a relatively small thickness and may be used as a template for embodying various electronic devices.

The interface control layer 21 may be formed of $Al_xIn_yGa_{1-x-y}N$ ($0 \leq x \leq 1$, $0 \leq y \leq 1$, $x+y<1$). The buffer layer 1200 and the interface control layer 21 may be formed of different materials for discrimination therebetween. For example, the buffer layer 1200 may be formed of an aluminum (Al) nitride, and the interface control layer 21 may be formed of a nitride that does not contain Al. For example, the buffer layer 1200 may be formed of an AlGaN, and the interface control layer 21 may be formed of a GaN. However, the present inventive concept is not limited thereto.

The interface control layer 21 may reduce the generation of a twist grain boundary at an interface with the nitride semiconductor layer 1300. The interface control layer 21 may have a thickness of about 2 nm to about 1000 nm, and may be formed such that the ratio of the roughness of the interface control layer 21 to the roughness of the buffer layer 1200 is about 3 or less. The thickness and the roughness of the interface control layer 21 may be implemented by controlling growth conditions such as temperature and pressure. For example, the interface control layer 21 may be formed at a temperature of about 900° C. to about 1050° C. under a pressure of about 20 torr to about 500 torr. The growth conditions of the interface control layer 21 may be different from the growth condition of the nitride semiconductor layer 1300 formed on the interface control layer 21.

As the thickness of the interface control layer 21 is increased, the generation of a twist grain boundary at the interface between the interface control layer 21 and the nitride semiconductor layer 1300 may be reduced. However, when the thickness of the interface control layer 21 is increased, the crystallinity of the entire thin film may be degraded. This is because defects may increase since the interface control layer 21 grows at lower temperature than the nitride semiconductor layer 1300. Therefore, it may be desirable to reduce the generation of a twist grain boundary while reducing the thickness of the interface control layer 21.

When the twist grain boundary is reduced, the defect of the nitride semiconductor layer 1300 stacked on the interface control layer 21 may be reduced. That is, the interface control layer 21 may have a thickness of about 2 nm to about 1000 nm and may have a roughness ratio of about 3 or less with respect to the buffer layer 1200, thereby reducing the defect of the nitride semiconductor layer 1300 formed thereon. Therefore, as compared with a thick layer that does not use the interface control layer 21, the same level of crystallinity may be obtained at a small thickness, and the thickness of the entire structure may be reduced. Also, the process time and cost for an epitaxial growth process for the semiconductor device according to an embodiment of the present inventive concept may be reduced.

Figure 27:
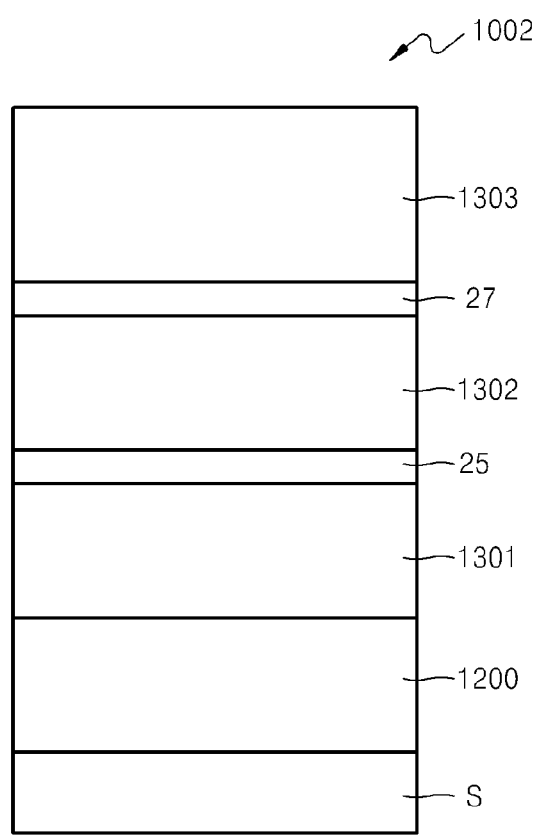
FIG. 27 is a schematic cross-sectional view of a semiconductor device according to another embodiment of the present inventive concept.

FIG. 27 is a schematic cross-sectional view of a semiconductor device 1002 according to another embodiment of the inventive concept.

The semiconductor device 1002 includes a silicon substrate S, the buffer layer 1200, and a nitride semiconductor layer. The nitride semiconductor layer may include a plurality of layers. At least one mask layer 25 is provided between the plurality of nitride semiconductor layers, and at least one interlayer 27 is provided between the plurality of nitride semiconductor layers on the mask layer 25. The interlayer 27 may compensate for a relative tensile stress due to the nitride semiconductor layer formed on the mask layer 25.

Referring to FIG. 27, the plurality of nitride semiconductor layers may include a first nitride semiconductor layer 1301, a second nitride semiconductor layer 1302, and a third nitride semiconductor layer 1303, which are formed of $Al_xIn_yGa_{1-x-y}N$ ($0 \leq x$, $y \leq 1$, $x+y<1$).

The mask layer 25 may be formed of a silicon nitride (SiNx) or a titanium nitride (TiN). For example, a SiNx mask layer may be formed using silane (SiH4) and ammonium gas. The mask layer 25 may be formed to partially (not completely) cover the first nitride semiconductor layer 1301 on the plane such that a portion of the nitride semiconductor layer 1301 is exposed. Therefore, an exposed region of the first nitride semiconductor layer 1301 may be determined according to the degree of coverage of the first nitride semiconductor layer 1301 by the mask layer 25, and an initial island growth shape of the second nitride semiconductor layer 1302 formed thereon may vary accordingly. For example, when the mask region of SiNx is increased to reduce the exposed area of the first nitride semiconductor layer 1301, the density of the initial island of the second nitride semiconductor layer 1302 grown on the mask layer 25 may decrease but the size of a coalesced island may increase relatively. In this case, the thickness of the coalesced nitride semiconductor layer may also increase.

The dislocation density may be reduced by the mask layer 25, and this may be described as an effect of masking a threading dislocation directly by the mask layer 25 or a threading dislocation bending effect through an island facet of the second nitride semiconductor layer 1302. The coalescence thickness and the dislocation density of the second nitride semiconductor layer 1302 may vary according to parameters of growth conditions such as temperature, pressure, and a V/III source ratio. The growth conditions of the SiNx mask layer and the second nitride semiconductor layer 1302 may be selected such that the surface pit density caused by the threading dislocation in a flat state after completion of coalescence may be $5E8/cm^2$ or less.

The first nitride semiconductor layer 1301 may undergo a compressive stress from the buffer layer 1200 having a relatively small lattice. The compressive stress may be gradually relaxed as the thickness of the nitride semiconductor layer increases. However, when the mask layer 25 is provided between the first nitride semiconductor layer 1301 and the second nitride semiconductor layer 1302, the stress between the two nitride semiconductor layers may be decoupled and thus the compressive stress transmitted to the second nitride semiconductor layer 1302 may be blocked. Also, the second nitride semiconductor layer 1302 may grow initially in an island type, and a relative tensile stress may be generated in the process of island coalescence. As a result, the first nitride semiconductor layer 1301 may undergo a strong compressive stress due to the buffer layer 1200, but the second nitride semiconductor layer 1302 on the mask layer 25 may undergo a weaker compressive stress or tensile stress by stress decoupling and island coalescence. When the thickness of the layer having a relatively weak compressive stress exceeds a critical point, cracks may occur at the thin film during cooling. Therefore, the possibility of occurrence of cracks may increase as the thickness of the second nitride semiconductor layer 1302 is increased by enhancing island growth. Therefore, the thickness of the second nitride semiconductor layer 1302 may be selected to reduce the dislocation density while preventing the occurrence of cracks.

Therefore, the thickness of the mask layer 25 may be maintained and the coalescence thickness of the second nitride semiconductor layer 1302 may be reduced to reduce the dislocation density while preventing the occurrence of cracks. To this end, the growth conditions of the second nitride semiconductor layer 1302 may be controlled. For example, horizontal growth may be accelerated by increasing the growth temperature, reducing the growth pressure, or increasing the V/III source ratio.

However, even though the growth conditions of the second nitride semiconductor layer 1302 are controlled, when the second nitride semiconductor layer 1302 is grown to a thickness of about 2 μm or more and is cooled to normal temperature, cracks may occur because the tensile stress caused by the thermal expansion coefficient difference between the silicon substrate S and the second nitride semiconductor layer 1302 may not be controlled.

Therefore, in order to compensate for the tensile stress generated during cooling of the nitride semiconductor layer, at least one interlayer 27 may be arranged on the second nitride semiconductor layer 1302. The interlayer layer 27 may be formed of at least one selected from $Al_{x0}In_{y0}Ga_{1-x0-y0}N$ ($0 \leq x0$, $y0 \leq 1$, $x0+y0 \leq 1$), step-grade $Al_xIn_yGa_{1-x-y}N$ ($0 \leq x$, $y \leq 1$, $x+y \leq 1$), and $Al_{x1}In_{y1}Ga_{1-x1-y1}N/Al_{x2}In_{y2}Ga_{1-x2-y2}N$ ($0 \leq x1$, x2, y1, $y2 \leq 1$, $x1 \neq x2$ or $y1 \neq y2$) superlattices, to apply a compressive stress to the nitride semiconductor layer thereon.

When the third nitride semiconductor layer 1303 is formed on the interlayer 27, the third nitride semiconductor layer 1303 may have a high compressive stress. The occurrence of cracks may be reduced by compensating for the weak compressive stress of tensile stress on the second nitride semiconductor layer 1302 by using the compressive stress of the third nitride semiconductor layer 1303.

Figure 28:
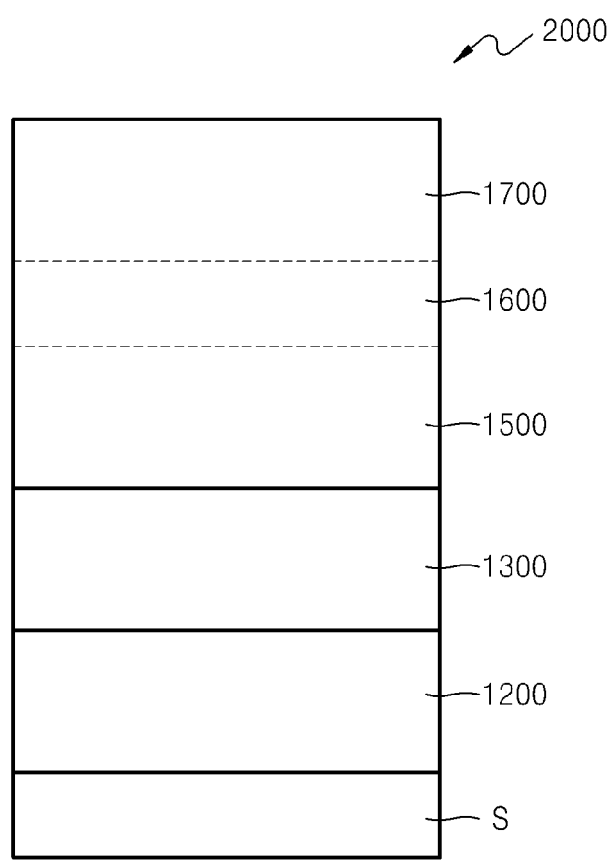
FIG. 28 is a schematic cross-sectional view of a semiconductor device according to another embodiment of the present inventive concept.

FIG. 28 is a schematic cross-sectional view of a light-emitting device 2000 as a semiconductor device according to another embodiment of the inventive concept.

According to the present embodiment, the light-emitting device 2000 may include a silicon substrate S, a buffer layer 1200 formed on the silicon substrate S, a nitride semiconductor layer 1300 formed on the buffer layer 1200, and a device layer formed on the nitride semiconductor layer 1300.

The device layer may have a light-emitting structure including a first-type semiconductor layer 1500, an active layer 1600, and a second-type semiconductor layer 1700.

The first-type semiconductor layer 1500 may be a semiconductor layer doped in a first type. The first-type semiconductor layer 1500 may be formed of Group III-V nitride semiconductor materials. For example, the first-type semiconductor layer 1500 may be formed of a semiconductor material $Al_xGa_yIn_zN$ ($0 \le x \le 1$, $0 \le y \le 1$, $0 \le z \le 1$, $x+y+z=1$) doped with an n-type dopant. Examples of the n-type dopant may include Si, Ge, Se, and Te.

The second-type semiconductor layer 1700 may be a semiconductor layer doped in a second type. The second-type semiconductor layer 1700 may be formed of Group III-V nitride semiconductor materials. For example, the second-type semiconductor layer 1700 may be formed of a semiconductor material $Al_xGa_yIn_zN$ ($0 \le x \le 1$, $0 \le y \le 1$, $0 \le z \le 1$, $x+y+z=1$) doped with a p-type dopant. Examples of the p-type dopant may include Mg, Zn, and Be.

The active layer 1600 emits light by electron-hole recombination. Energy corresponding to the energy band gap of the active layer 1600 may be emitted in the form of light. The active layer 1600 may include a structure of a single quantum well generated by controlling a band gap by periodically changing x, y, z values in $Al_xGa_yIn_zN$, or a multi quantum well. For example, a quantum well structure may be formed by pairing a quantum well layer and a barrier layer in the form of InGaN/GaN, InGaN/InGaN, InGaN/AlGaN, or InGaN/InAlGaN, and a light-emitting wavelength band may be controlled by controlling a band-gap energy according to an In mole ratio in an InGaN layer. In general, when the In mole ratio changes by about 1%, the light-emitting wavelength shifts by about 5 nm.

The first-type semiconductor layer 1500 and the second-type semiconductor layer 1700 are illustrated as having a single-layer structure; however, the first-type semiconductor layer 1500 and the second-type semiconductor layer 1700 may have a multi-layer structure.

The first-type semiconductor layer 1500 is illustrated as being formed on the nitride semiconductor layer 1300; however, the first-type semiconductor layer 1500 may also be formed by doping the nitride semiconductor layer 1300 with a first-type dopant.

The device layer has been described as including an LED structure; however, the device layer may also include a laser diode (LD) structure, a field-effect transistor (FED) structure, a high electron mobility transistor (HEMT) structure, or a Schottky diode structure.

The semiconductor device of FIG. 28 may include various electrode structures for injecting a current to recombine electrons and holes in the active layer 1600, examples of which are illustrated in FIGS. 29 through 32.

FIGS. 29 through 32 are cross-sectional views illustrating various examples of a light-emitting device 2001 as a semiconductor device according to another embodiment of the inventive concept.

Figure 29:
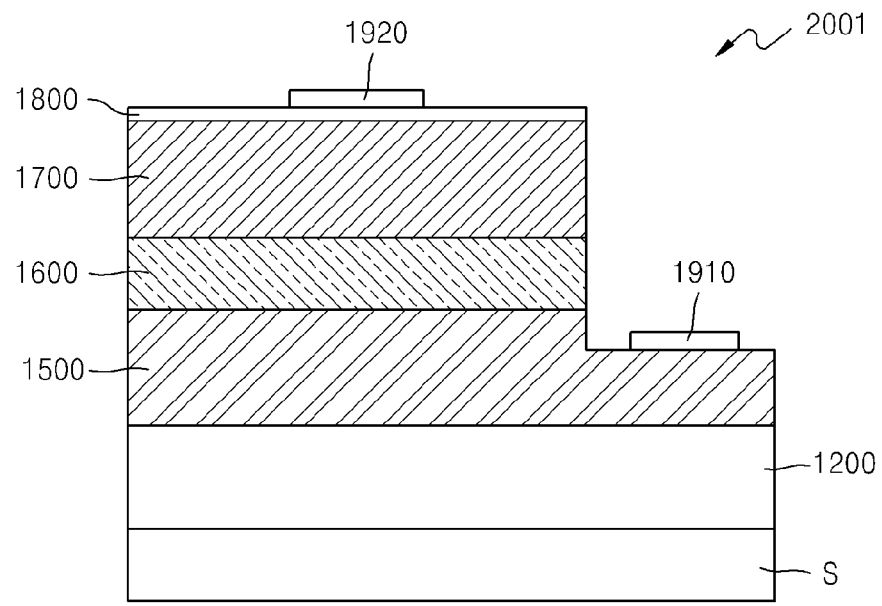
FIGS. 29 through 32 are cross-sectional views illustrating examples of a light-emitting device as a semiconductor device according to another embodiment of the present inventive concept.

Referring to FIG. 29, in the light-emitting device 2001, a first electrode 1910 may be formed on a portion of a first-type semiconductor layer 1500, which is exposed by etching predetermined regions of a second-type semiconductor layer 1700, an active layer 1600, and the first-type semiconductor layer 1500. A second electrode 1920 may be formed on the second-type semiconductor layer 1700. Also, a transparent electrode layer 1800 may be formed between the second-type semiconductor layer 1700 and the second electrode 1920.

This type of chip structure is referred to as an epi-up structure.

The first electrode 1910 and the second electrode 1920 may be formed of any one or any alloy of metals such as Ag, Al, Ni, Cr, Pd, Cu, Pt, Sn, W, Au, Rh, Ir, Ru, Mg, and Zn. The first electrode 1910 and the second electrode 1920 may be formed in an at least two-layered structure such as Ni/Ag, Zn/Ag, Ni/Al, Zn/Al, Pd/Ag, Pd/Al, Ir/Ag, Ir/Au, Pt/Ag, Pt/Al, or Ni/Ag/Pt.

The transparent electrode layer 1800 may be formed of a transparent conductive oxide (TCO). For example, the transparent electrode layer 1800 may be formed of ITO (indium tin oxide), IZO (indium zinc oxide), AZO (aluminum zinc oxide), ZnO, GZO (ZnO:Ga), $In_2O_3$, $SnO_2$, CdO, $CdSnO_4$, or $Ga_2O_3$.

Figure 30:
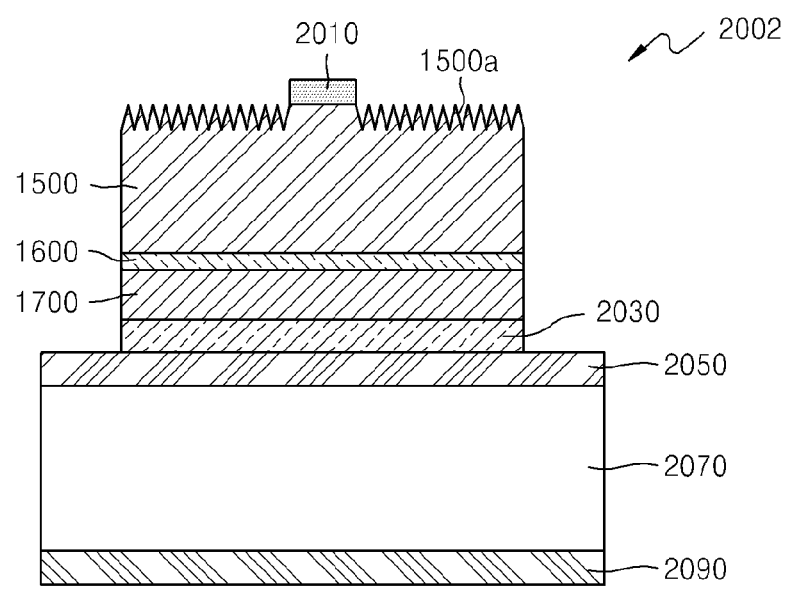

FIG. 30 is a schematic cross-sectional view of a vertical light-emitting device 2002 as a semiconductor device according to another embodiment of the inventive concept.

In the light-emitting device 2002, a silicon substrate S and a buffer layer 1200 used in epitaxial growth may be removed, and a support substrate 2070 may be joined to a second-type semiconductor layer 1700.

In order to increase a light extraction efficiency, a top surface of a first-type semiconductor layer 1500, which is exposed by removing the silicon substrate S and the buffer layer 1200, may be textured to form an uneven surface 1500a having an uneven pattern. The uneven pattern is not limited to the illustrated shape, but may have various periods, heights and shapes and may also be formed in irregular patterns.

In FIG. 30, both the silicon substrate S and the buffer layer 1200 may be removed. However, at least a portion of the buffer layer 1200 may be left on the first-type semiconductor layer 1500, and may be textured together with the first-type semiconductor layer 1500 to form an uneven surface 1500a.

A first electrode 2010 may be formed on the first-type semiconductor layer 1500. A second electrode 2030 may be formed on a bottom surface of the second-type semiconductor layer 1700. A bonding metal layer 2050 may be formed between the second electrode 2030 and the support substrate 2070. For example, the bonding metal layer 2050 may be formed of Au/Sn. The support substrate 2070 may be a Si substrate or a SiAl substrate. A back metal layer 2090 may be formed on a bottom surface of the support substrate 2070.

Figure 31:
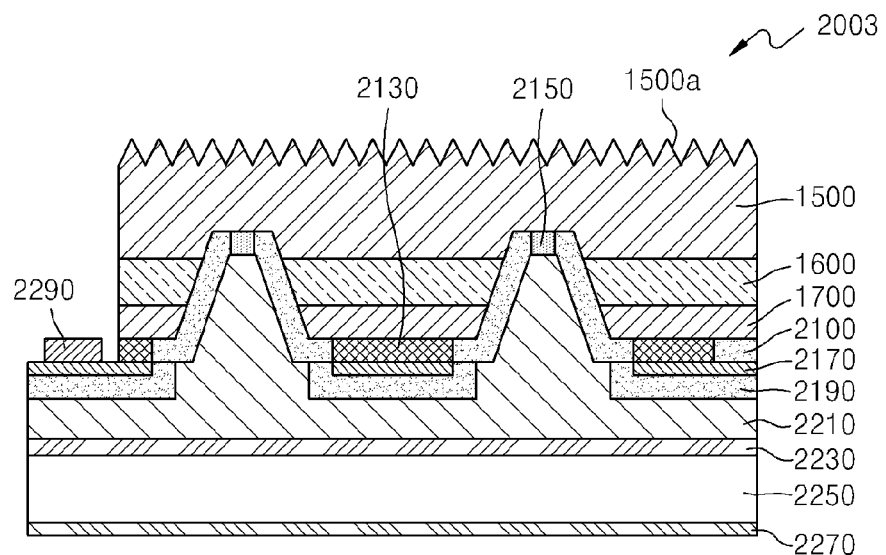

FIG. 31 is a schematic cross-sectional view of a vertical-horizontal light-emitting device 2003 as a semiconductor device according to another embodiment of the inventive concept.

In the light-emitting device 2003, a silicon substrate S and a buffer layer 1200 used in epitaxial growth may be removed. A support substrate 2250 may be joined to a second-type semiconductor layer 1700.

In order to increase a light extraction efficiency, a top surface of a first-type semiconductor layer 1500, which is exposed by removing the silicon substrate S and the buffer layer 1200, may be textured to form an uneven surface 1500a. In FIG. 31, both the silicon substrate S and the buffer layer 1200 may be removed. However, at least a portion of the buffer layer 1200 may be left on the first-type semiconductor layer 1500, and may be textured together with the first-type semiconductor layer 1500.

In order to form a first electrode 2150 contacting the first-type semiconductor layer 1500, a plurality of via-holes may be formed to penetrate the first-type semiconductor layer 1500 and an active layer 1600. A second electrode 2130 may be formed on the second-type semiconductor layer 1700. A metal layer 2170 for connection with an electrode pad 2290 may be formed on the second electrode 2130. A first passivation layer 2100 may be formed to cover side surfaces of the via-holes and a portion of the top surface of the second-type semiconductor layer 1700, and a second passivation layer 2190 may be formed to cover the metal layer 2170. A barrier metal layer 2210 may be formed to connect with the first electrode 2150 and fill the via-holes.

A bonding metal layer 2230 may be formed on a top surface of the support substrate 2250, and a back metal layer 2270 may be formed on a bottom surface of the support substrate 2250.

Figure 32:
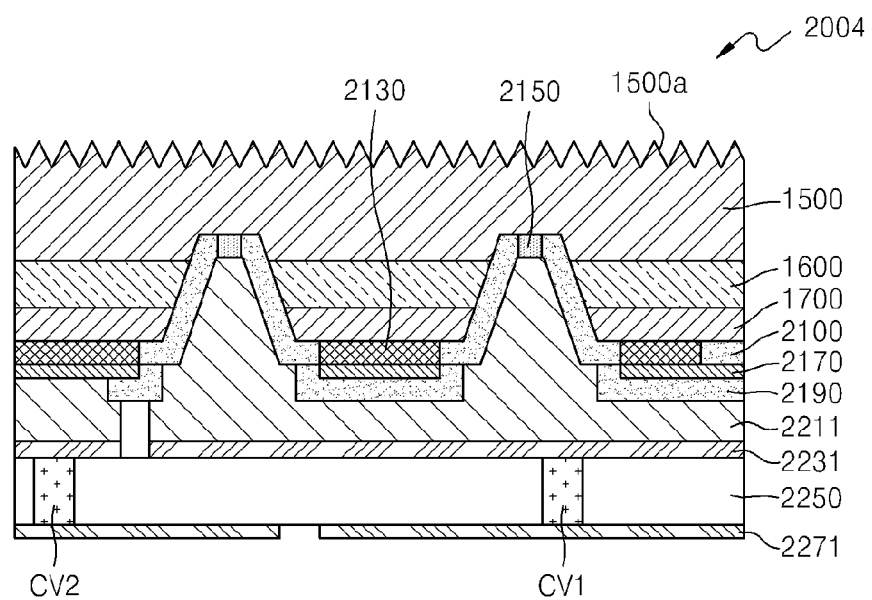

FIG. 32 is a schematic cross-sectional view of a flip-chip type light-emitting device 2004 as a semiconductor device according to another embodiment of the inventive concept.

The light-emitting device 2004 is different from the light-emitting device 2003 of FIG. 31 in that both a first electrode 2150 and a second electrode 2130 may be electrically exposed downward.

That is, a second passivation layer 2190 may be patterned to expose a portion of a metal layer 2170 contacting the second electrode 2130. Also, a barrier metal layer 2211 may be patterned to be electrically divided into two portions, such that one portion thereof contacts the first electrode 2150 and the other portion contacts the second electrode 2130.

A support substrate 2250 may be a non-conductive substrate in which a first conductive via CV1 and a second conductive via CV2 are formed. A bonding metal layer 2231 on the support substrate 2250 and a back metal layer 2271 under the support substrate 2250 may be each patterned to have two regions that are electrically insulated from each other. One region of the bonding metal layer 2231 and one region of the back metal layer 2271 may be electrically connected to each other by the first conductive via CV1, and the other region of the bonding metal layer 2231 and the other region of the back metal layer 2271 may be electrically connected to each other by the second conductive via CV2, such that the first electrode 2150 and the second electrode 2130 are electrically exposed to the outside.

A non-conductive substrate in which conductive vias are formed has been described as the support substrate 2250. However, the present inventive concept is not limited thereto. That is, the support substrate 2250 may also be a conductive substrate in which insulating vias are formed.

FIGS. 33A through 33J are views illustrating a method of manufacturing the semiconductor device 2003 of FIG. 31.

Figure 33A:
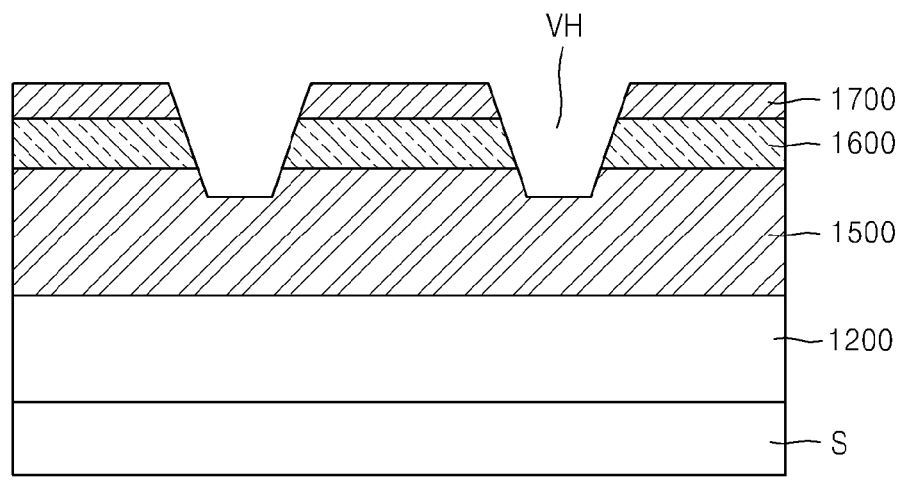
FIGS. 33A through 33J are views illustrating a method of manufacturing the semiconductor device of FIG. 31.

Referring to FIG. 33A, a silicon substrate S, a buffer layer 1200, a first-type semiconductor layer 1500, an active layer 1600, and a second-type semiconductor layer 1700 may be sequentially formed in this order. Herein, an undoped nitride semiconductor layer (not separately shown) may also be formed between the buffer layer 1200 and the first-type semiconductor layer 1500. Thereafter, a plurality of via-holes VH may be formed to penetrate the first-type semiconductor layer 1500 and the active layer 1600 and expose a portion of the second-type semiconductor layer 1700.

The buffer layer 1200, the first-type semiconductor layer 1500, the active layer 1600, and the second-type semiconductor layer 1700 may be formed on the silicon substrate S by well-known semiconductor growth methods such as metal organic chemical vapor deposition (MOCVD), molecular beam epitaxy (MBE), and hydride vapor phase epitaxy (HVPE).

In the forming of the first-type semiconductor layer 1500 and the second-type semiconductor layer 1700, dopant gases may be supplied to dope the first-type semiconductor layer 1500 and the second-type semiconductor layer 1700 with an n-type dopant or a p-type dopant. Examples of the n-type dopant may include Si, Ge, Se, and Te, and examples of the p-type dopant may include Zn, Cd, Be, Mg, Ca, and Ba.

Figure 33B:
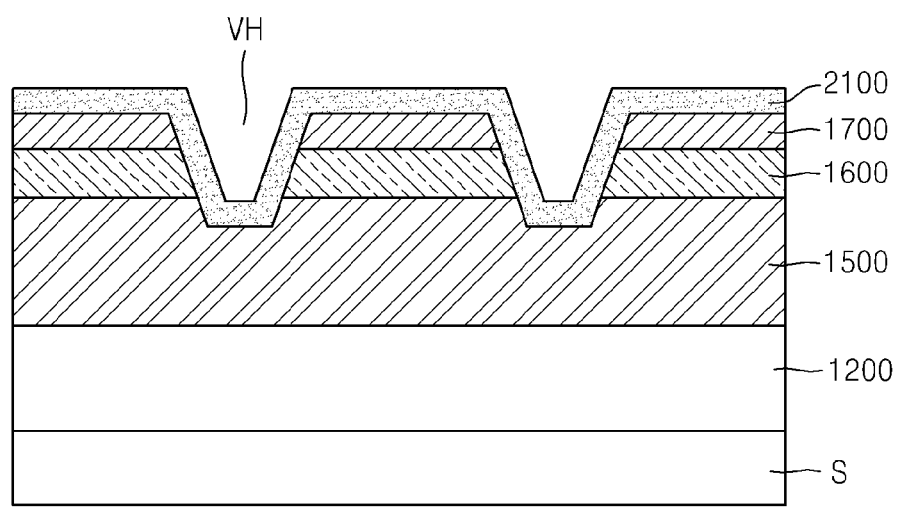

Referring to FIG. 33B, a first passivation layer 2100 may be formed on the top surface of the second-type semiconductor layer 1700 and the internal surfaces of the via-holes VH. For example, the first passivation layer 2100 may be formed by depositing an insulating material such as $SiO_2$ or $Al_2O_3$.

Figure 33C:
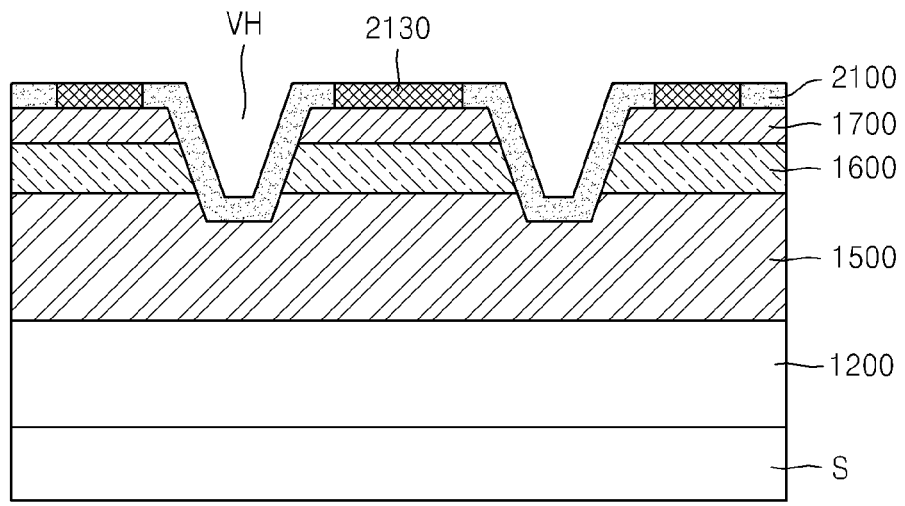

Referring to FIG. 33C, a second electrode 2130 may be formed on the second-type semiconductor layer 1700 that is exposed by etching a portion of the first passivation layer 2100 on the second-type semiconductor layer 1700.

Figure 33D:
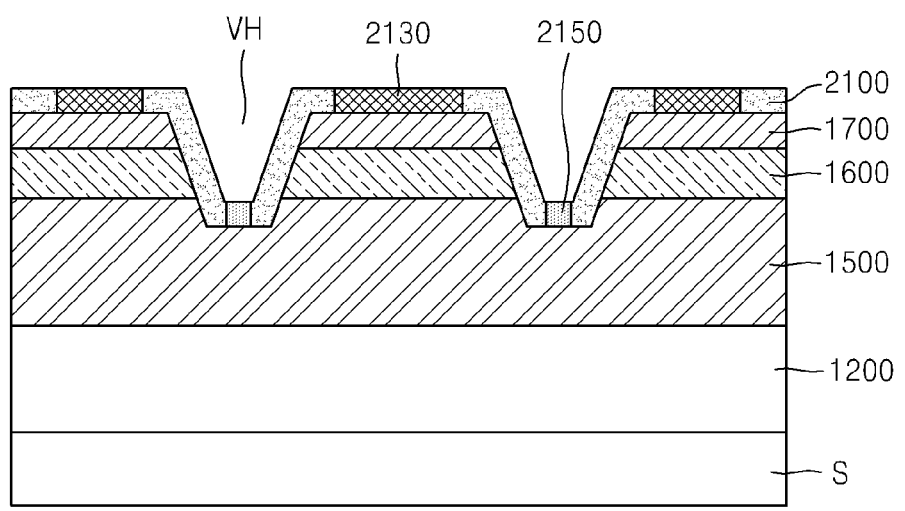

Referring to FIG. 33D, a first electrode 2150 may be formed on the first-type semiconductor layer 1500 that is exposed by etching a portion of the first passivation layer 2100 on the first-type semiconductor layer 1500. Herein, the first electrode 2150 may be formed by sputtering, plating, or depositing metal materials.

Figure 33E:
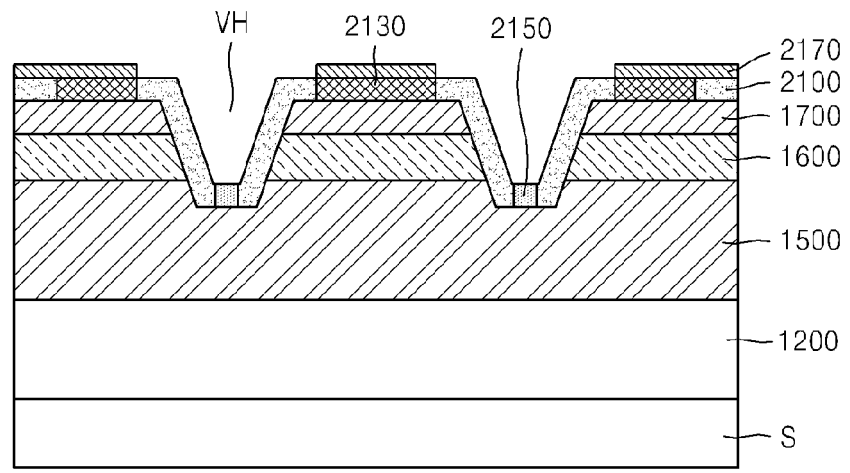

Referring to FIG. 33E, a metal layer 2170 may be formed on the second electrode 2130 to connect an electrode pad to the second electrode 2130 afterwards.

Figure 33F:
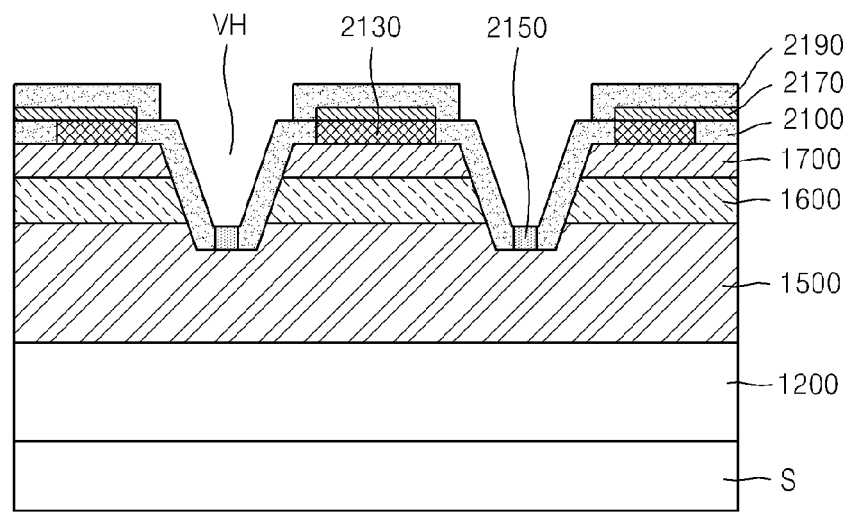

Referring to FIG. 33F, a second passivation layer 2190 may be formed of an insulating material to cover the metal layer 2170.

Figure 33G:
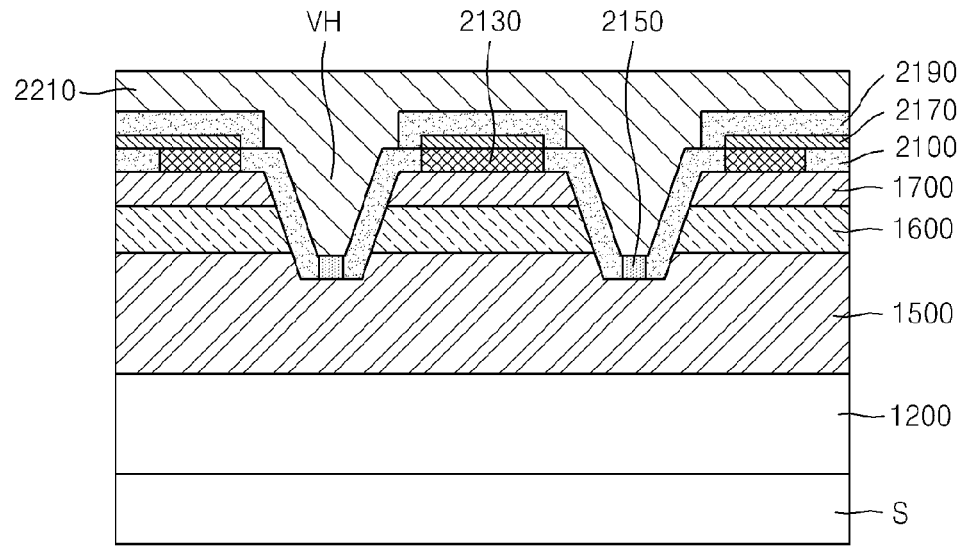

Referring to FIG. 33G, a barrier metal layer 2210 may be formed to connect with the first electrode 2150, fill the via-holes VH and cover the second passivation layer 2190. By the first passivation layer 2100 and the second passivation layer 2190, the barrier metal layer 2210 may be insulated from the second electrode 2130, the active layer 1600, and the second-type semiconductor layer 1700 and may be electrically connected to the first electrode 2150.

Figure 33H:
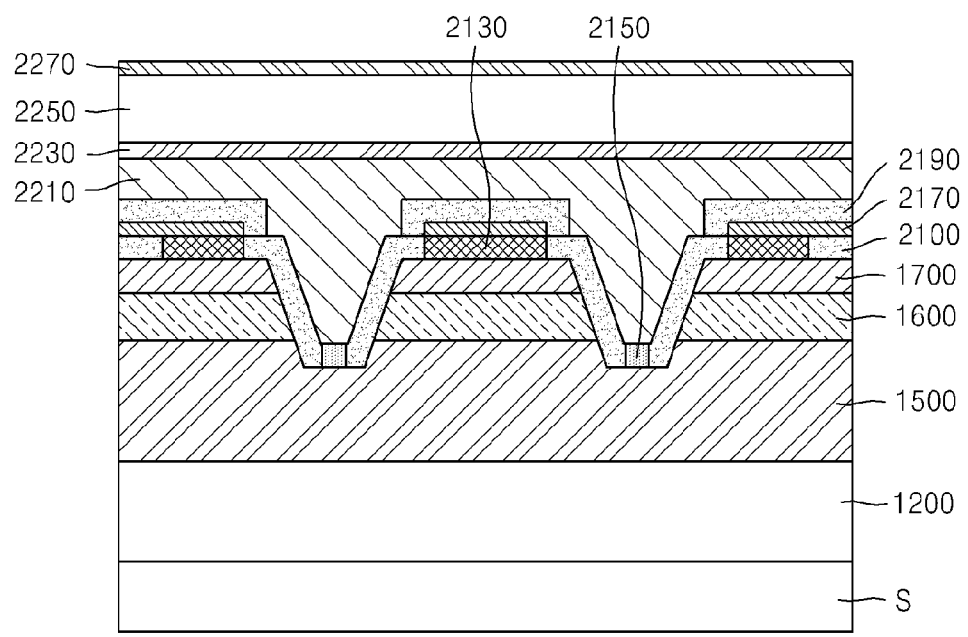

Referring to FIG. 33H, a support substrate 2250 may be attached onto the barrier metal layer 2210. The support substrate 2250 may be a Si substrate or a SiAl substrate. A back metal layer 2270 may be formed on the top surface of the support substrate 2250, and a bonding metal layer 2230 may be formed between the support substrate 2250 and the barrier metal layer 2210.

Figure 33I:
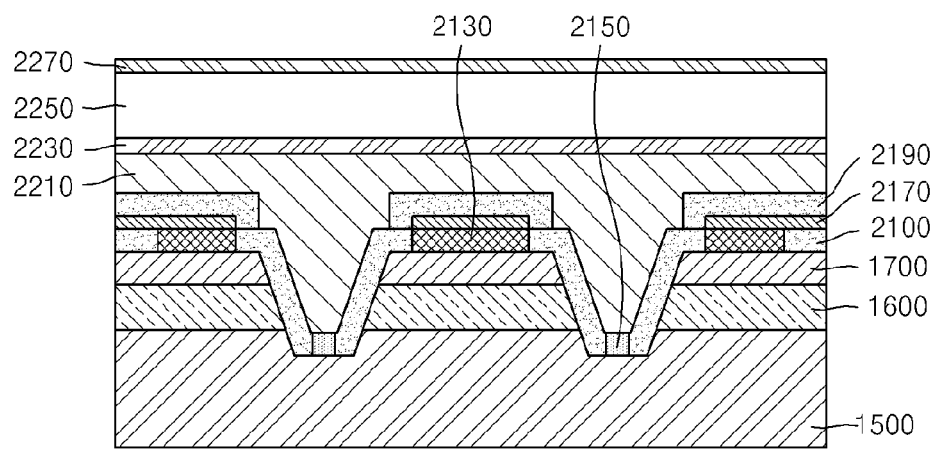

Referring to FIG. 33I, the silicon substrate S and the buffer layer 1200 may be removed. The silicon substrate S may be removed by etching or polishing. The buffer layer 1200 is illustrated as being completely removed; however, a portion of the buffer layer 1200 may be left on the first-type semiconductor layer 1500.

Figure 33J:
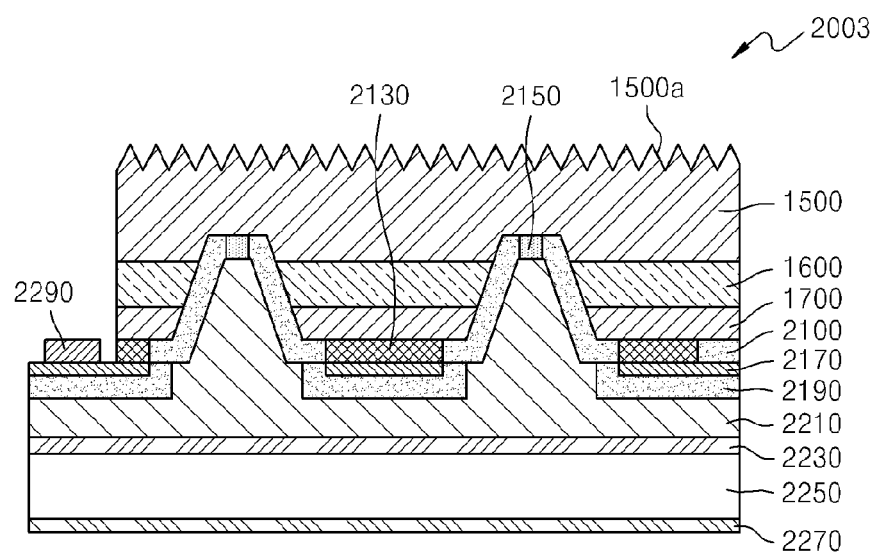

Referring to FIG. 33J, a top portion of the first-type semiconductor layer 1500 may be textured to form an uneven surface 1500a. In this case, when a portion of the buffer layer 1200 is left on the first-type semiconductor layer 1500, the portion of the buffer layer 1200 may also be textured to form the uneven surface 1500a.

Thereafter, the first-type semiconductor layer 1500, the active layer 1600, and a portion of the second-type semiconductor layer 1700 are etched to expose the metal layer 2170, and an electrode pad 2290 is formed on the exposed metal layer 2170.

The above manufacturing method illustrates a method of manufacturing the vertical/horizontal light-emitting device of FIG. 31; however, the present inventive concept is not limited thereto.

FIGS. 34A through 34E are views illustrating a method of manufacturing the semiconductor device 2004 of FIG. 32.

The light-emitting device 2004 of FIG. 32 is different from the light-emitting device 2003 of FIG. 31 only in a structure in which a first electrode 2150 and a second electrode 2130 are exposed to the outside, and operations of FIG. 33A through FIG. 33F are the same herein.

Figure 34A:
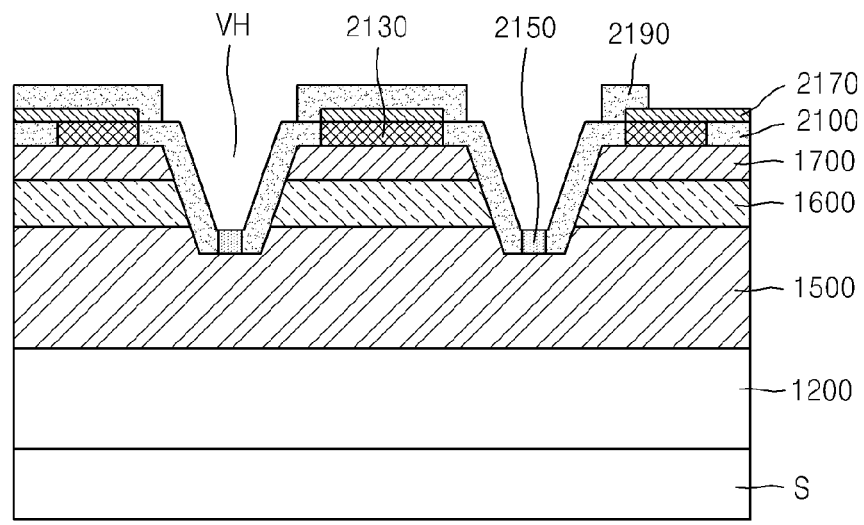
FIGS. 34A through 34E are views illustrating a method of manufacturing the semiconductor device of FIG. 32.

Referring to FIG. 34A, a portion of the second passivation layer 2190 may be etched to expose the metal layer 2170 joined to the second electrode 2130.

Figure 34B:
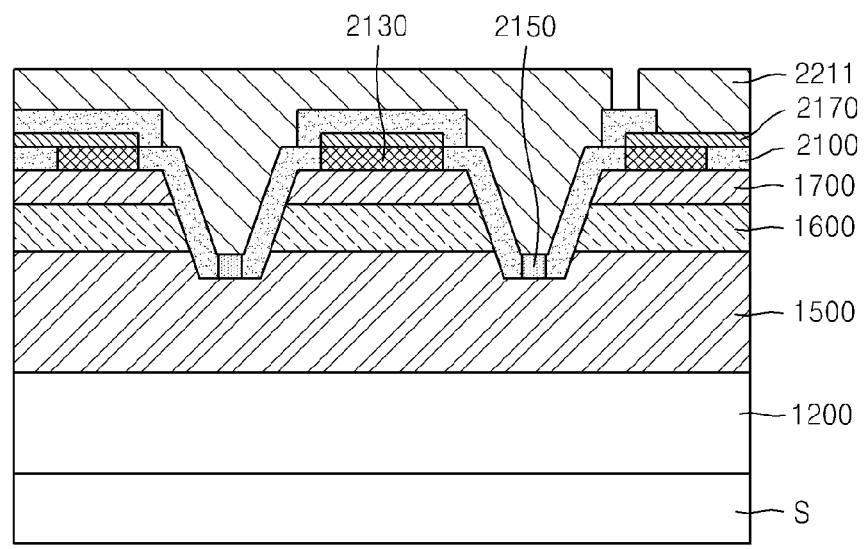

Referring to FIG. 34B, a barrier metal layer 2211 may be formed to have two regions that are electrically insulated from each other.

Figure 34C:
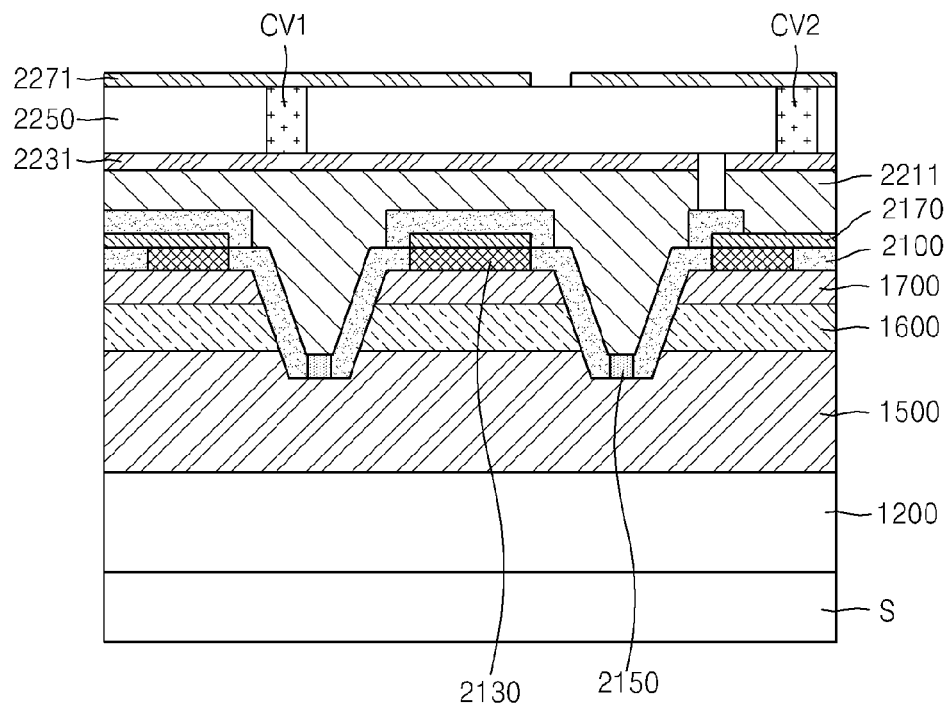

Referring to FIG. 34C, a support substrate 2250 may be joined onto the barrier metal layer 2211. A bonding metal layer 2231 and a back metal layer 2271 may be formed on both surfaces of the support substrate 2250 in which a first conductive via CV1 and a second conductive via CV2 are formed, and both the bonding metal layer 2231 and the back metal layer 2271 may be patterned to correspond to the two regions of the barrier metal layer 2211. Also, the first conductive via CV1 and the second conductive via CV2 may be formed to penetrate the support substrate 2250, such that the first conductive via CV1 connects one region of the bonding metal layer 2231 and one region of the back metal layer 2271, and the second conductive via CV2 connects the other region of the bonding metal layer 2231 and the other region of the back metal layer 2271.

Figure 34D:
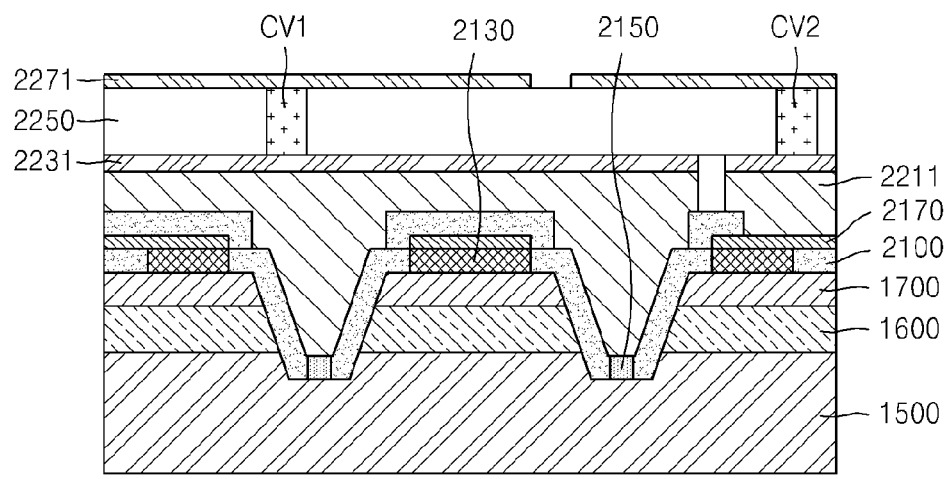

Referring to FIG. 34D, the silicon substrate S and the buffer layer 1200 may be removed. The silicon substrate S may be removed by etching or polishing. The buffer layer 1200 is illustrated as being completely removed; however, a portion of the buffer layer 1200 may be left on the first-type semiconductor layer 1500.

Figure 34E:
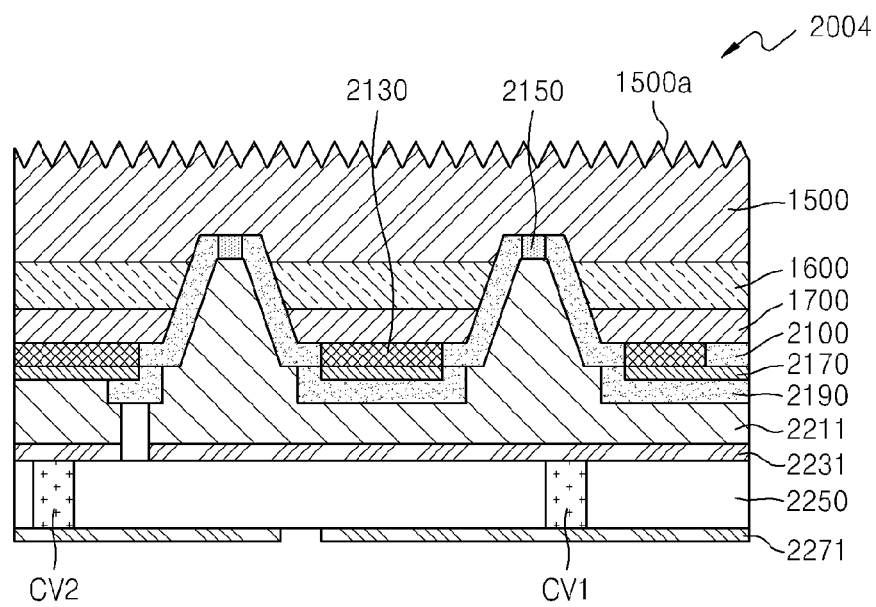

Referring to FIG. 34E, a top portion of the first-type semiconductor layer 1500 may be textured to form an uneven surface 1500a. In this case, when a portion of the buffer layer 1200 is left on the first-type semiconductor layer 1500, the portion of the buffer layer 1200 may also be textured to form the uneven surface 1500a.

The semiconductor device manufacturing methods using the semiconductor buffer structures according to the embodiments of the inventive concept may be modified into various types including a process of forming a device layer of a nitride stack on a buffer layer and removing a silicon substrate and/or a buffer layer when necessary.

Figure 35:
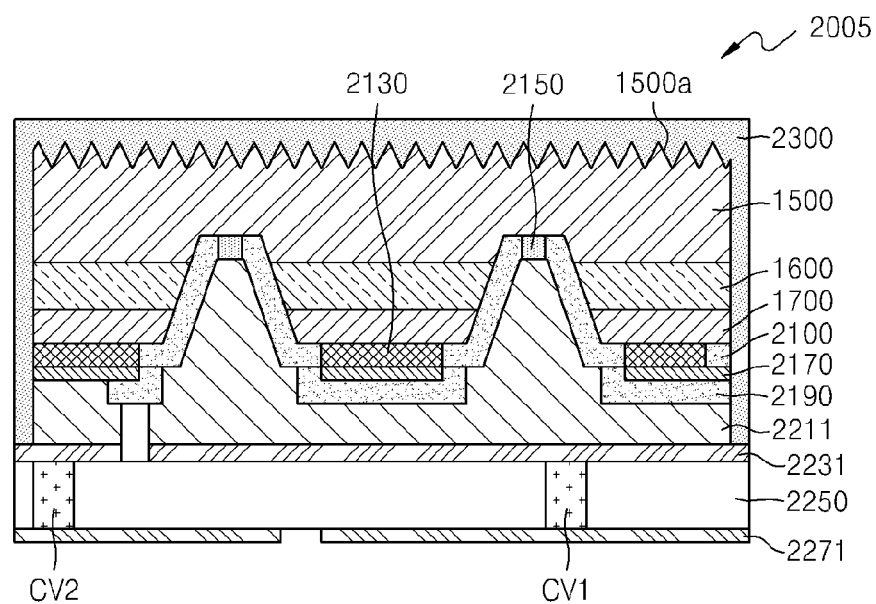
FIG. 35 is a cross-sectional view illustrating an example of a light-emitting device, which emits white light, as a semiconductor device according to another embodiment of the present inventive concept.

FIG. 35 is a cross-sectional view illustrating an example of a light-emitting device 2005, which emits white light, as a semiconductor device according to another embodiment of the inventive concept.

The light-emitting device 2005 may be formed by coating the semiconductor device 2004 of FIG. 34E with a wavelength conversion layer 2300.

The wavelength conversion layer 2300 may convert the wavelength of light emitted from the active layer 1600, and may have a wavelength conversion material such as a fluorescent substance or a quantum dot. When the wavelength conversion material is a fluorescent substance and blue light is emitted from the active layer 1600, the wavelength conversion layer 2300 may use a nitride-based fluorescent substance of MAlSiNx:Re ($1 \leq x \leq 5$) and a sulfide-based fluorescent substance of MD:Re as a red fluorescent substance. Herein, M is at least one selected from Ba, Sr, Ca, and Mg; D is at least one selected from the group consisting of S, Se, and Te; and Re is at least one selected from Eu, Y, La, Ce, Nd, Pm, Sm, Gd, Tb, Dy, Ho, Er, Tm, Yb, Lu, F, Cl, Br, and I. Also, examples of a green fluorescent substance includes a silicate-based fluorescent substance of M2SiO4:Re, a sulfide-based fluorescent substance of MA2D4:Re, a fluorescent substance of β-SiAlON:Re, and an oxide-based fluorescent substance of MA'2O4:Re'. Herein, M is at least one selected from Ba, Sr, Ca, and Mg; A is at least one selected from Ga, Al, and In; D is at least one selected from S, Se, and Te; A' is at least one selected from Sc, Y, Gd, La, Lu, Al, and In; Re is at least one selected from Eu, Y, La, Ce, Nd, Pm, Sm, Gd, Tb, Dy, Ho, Er, Tm, Yb, Lu, F, Cl, Br, and I; and Re' is at least one selected from Ce, Nd, Pm, Sm, Tb, Dy, Ho, Er, Tm, Yb, F, Cl, Br, and I.

Also, the wavelength conversion material may be a quantum dot. The quantum dot is a nanocrystal particle including a core and a shell, wherein the size of the core ranges from about 2 nm to about 100 nm. By controlling the size of the core, the quantum dot may be used as fluorescent materials emitting various colors such as blue (B), yellow (Y), green (G), and red (R). A core-shell structure constituting the quantum dot may be formed by hetero-joining at least two types of semiconductors among Group II-VI compound semiconductors (ZnS, ZnSe, ZnTe, CdS, CdSe, CdTe, HgS, HgSe, HgTe, MgTe, and the like), Group III-V compound semiconductors (GaN, GaP, GaAs, GaSb, InN, InP, InAs, InSb, AlAs, AlP, AlSb, AlS, and the like), and Group IV semiconductors (Ge, Si, Pb, and the like). In this case, an organic ligand using a material such as an oleic acid may be formed at the shell of the quantum dot to terminate molecular binding at the shell surface, suppress cohesion of the quantum dot, improve dispersibility in resin such as silicon resin or epoxy resin, and improve a function of a fluorescent substance.

In FIG. 35, the wavelength conversion layer 2300 is illustrated as covering the entire light-emitting structure including the first-type semiconductor layer 1500, the active layer 1600, and the second-type semiconductor layer 1700, that is, both the upper portion and the side portion. However, this is merely exemplary, and the wavelength conversion layer 2300 may be formed only on the first-type semiconductor layer 1500.

Figure 36:
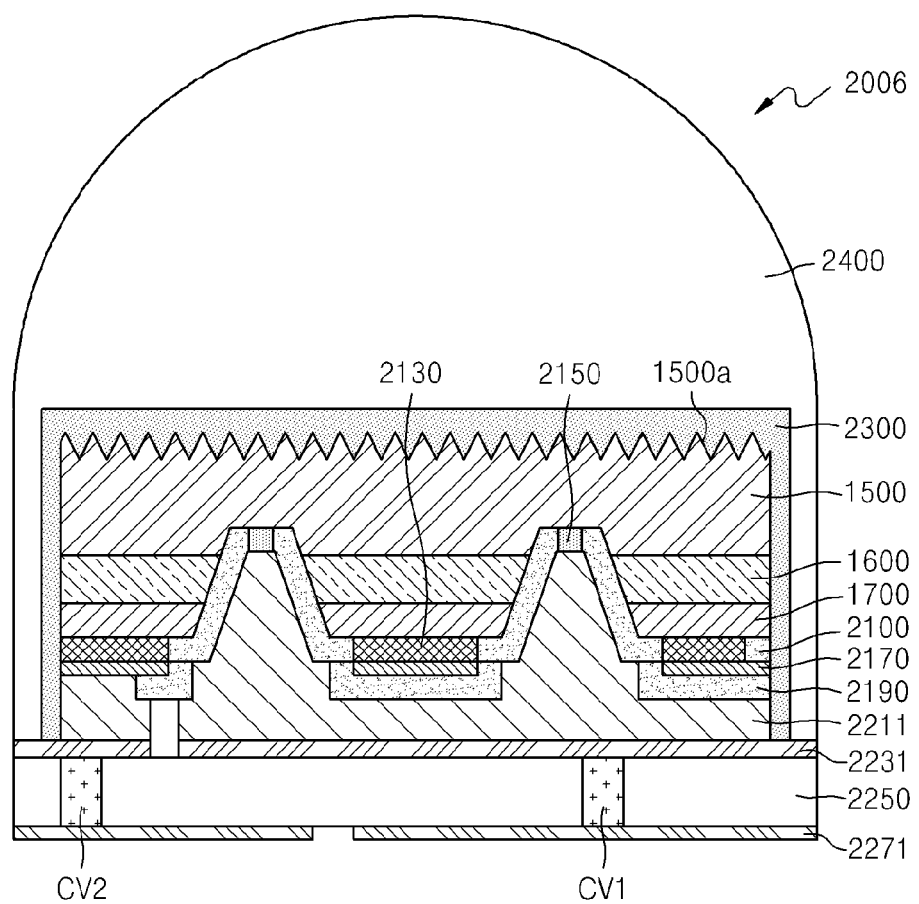
FIG. 36 is a cross-sectional view illustrating an example of a light-emitting device package as a semiconductor device according to another embodiment of the present inventive concept.

FIG. 36 is a cross-sectional view illustrating an example of a light-emitting device package 2006 as a semiconductor device according to another embodiment of the inventive concept.

The light-emitting device package 2006 may further include a lens 2400 formed on the light-emitting device 2005 of FIG. 35. The lens 2400 may function as a passivation layer for a light-emitting structure, and may also control the viewing angle of light emitted from the light-emitting structure. The lens 2400 may be formed in a separate chip, or may be formed at a wafer level and diced together with the support substrate 2250. In FIG. 36, the lens 2400 is illustrated as covering both the upper portion and the side portion of the light-emitting device. However, this is merely exemplary, and the lens 2400 may be disposed only at the upper portion.

In the light-emitting device and the light-emitting device package described above, a silicon growth substrate may be used to grow a light-emitting structure, and a silicon-based support substrate may be used to remove the growth substrate. In this case, the thermal expansion coefficient of the growth substrate may be substantially equal to the thermal expansion coefficient of the support substrate. Therefore, when the support substrate is attached, and when the growth substrate is removed, the stress generated at the wafer may be minimized and thus the wafer may be little warped. Accordingly, in manufacturing the above-described chips or chip-scale packages, handling is easy and the yield is improved.

Figure 37:
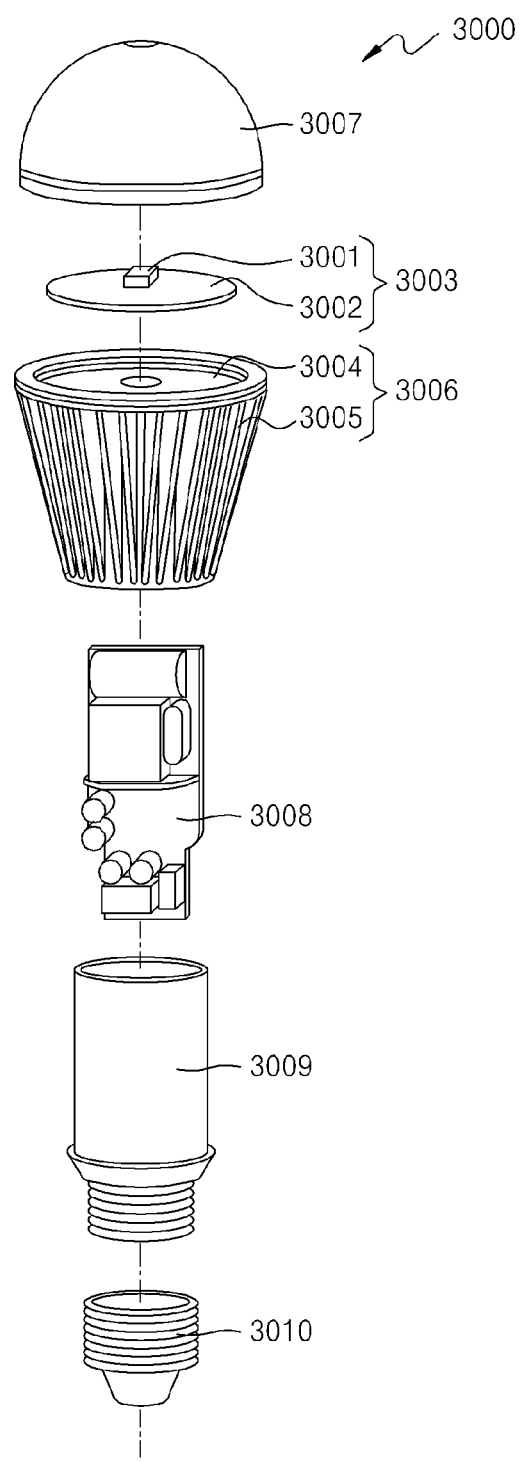
FIG. 37 is an exploded perspective view illustrating an example of an illumination device using a light-emitting device package, according to an embodiment of the present inventive concept.

FIG. 37 is an exploded perspective view illustrating an example of an illumination device 3000 using a light-emitting device package according to an embodiment of the inventive concept.

Referring to FIG. 37, a bulb-type lamp is illustrated as an example of the illumination device 3000, and the illumination device 3000 may include a light-emitting module 3003, a driving unit 3008, and an external connection portion 3010. Also, the illumination device 3000 may further include external structures such as an external housing 3006, an internal housing 3009, and a cover portion 3007.

The light-emitting module 3003 may include a light-emitting package 3001 and a circuit board 3002 on which the light-emitting package 3001 is mounted. The light-emitting package 2006 illustrated in FIG. 36 may be used as the light-emitting package 3001. However, the inventive concept is not limited thereto, and various types of light-emitting packages manufactured by using the semiconductor buffer structures according to embodiments of the present inventive concept may be used as the light-emitting package 3001. In FIG. 37, one light-emitting package 3001 may be mounted on the circuit board 3002; however, a plurality of light-emitting packages 3001 may be mounted thereon when necessary. In this case, the plurality of light-emitting packages 3001 may be the same type of light-emitting packages that emit light of the same wavelength. Alternatively, the plurality of light-emitting packages 3001 may be different types of light-emitting packages that emit light of different wavelengths. For example, the light-emitting package 3001 may be configured to include at least one of a light-emitting device for emitting white light by combination of a blue LED and a yellow, green, red or orange fluorescent substance, a violet light-emitting device, a blue light-emitting device, a green light-emitting device, a red light-emitting device, and an infrared light-emitting device. In this case, the illumination device 3000 may adjust a color rendering index (CRI) from a natrium (Na) lamp level (40) to a solar light level (100), and may generate various white lights with color temperatures ranging from a candlelight level (1500K) to a blue sky level (12000K). Also, when necessary, the illumination device 3000 may generate violet, blue, green, red or orange visible light or infrared light to adjust the color of illumination according to atmospheres and feelings. Also, the illumination device 3000 may generate a specific wavelength of light for accelerating the growth of plants.

Also, the illumination device 3000 may include the external housing 3006 that acts as a heat dissipation portion. The external housing 3006 may include a heat dissipation plate 3004 that directly contacts the light-emitting module 3003 to improve a heat dissipation effect, and a heat dissipation fin 3005 that increases a surface area for effective heat dissipation. Also, the illumination device 3000 may include a cover portion 3007. The cover portion 3007 may be mounted on the light-emitting module 3003 and have the shape of a convex lens. The driving unit 3008 may be installed in the internal housing 3009 and connected to the external connection portion 310 having a socket structure, to receive power from an external power supply. The driving unit 3008 may convert the power into a suitable current source for driving the semiconductor light-emitting device 3001 of the light-emitting module 3003. For example, the driving unit 3008 may include an AC-DC converter or a rectification circuit component.

It should be understood that the exemplary embodiments described therein should be considered in a descriptive sense only and not for purposes of limitation. Descriptions of features or aspects within each embodiment should typically be considered as available for other similar features or aspects in other embodiments.

While the inventive concept has been particularly shown and described with reference to exemplary embodiments thereof, it will be understood that various changes in form and details may be made therein without departing from the spirit and scope of the following claims.

What is claimed is:

1. A method of manufacturing a semiconductor device, comprising:
    preparing a silicon substrate;
    forming a buffer layer on the silicon substrate; and
    forming a nitride semiconductor layer on the buffer layer,
    wherein the buffer layer comprises:
        a first layer that comprises $Al_xIn_yGa_{1-x-y}N$ ($0 \leq x \leq 1$, $0 \leq y \leq 1$, $0 \leq x+y \leq 1$) and has a lattice constant LP1 smaller than a lattice constant LP0 of the silicon substrate;
        a second layer that is formed on the first layer, comprises $Al_xIn_yGa_{1-x-y}N$ ($0 \leq x < 1$, $0 \leq y < 1$, $0 \leq x+y < 1$), and has a lattice constant LP2 greater than LP1 and smaller than LP0; and
        a third layer that is formed on the second layer, comprises $Al_xIn_yGa_{1-x-y}N$ ($0 \leq x < 1$, $0 \leq y < 1$, $0 \leq x+y < 1$), and has a lattice constant LP3 smaller than LP2, and
    wherein the buffer layer is formed so as to apply a compressive stress to the nitride semiconductor layer.

2. The method of claim 1, wherein the lattice constant LP3 of the third layer is equal to or greater than LP1.

3. The method of claim 1, wherein the lattice constant LP3 of the third layer is greater than LP1.

4. The method of claim 1, wherein the third layer is formed to have a thickness such that lattice relaxation occurs.

5. The method of claim 1, wherein the buffer layer further comprises a fourth layer that is formed on the third layer, comprises $Al_xIn_yGa_{1-x-y}N$ ($0 \leq x < 1$, $0 \leq y < 1$, $0 \leq x+y < 1$), and has a lattice constant LP4 greater than LP2.

6. The method of claim 1, wherein the buffer layer further comprises a plurality of layers that are formed of a material comprising $Al_xIn_yGa_{1-x-y}N$ ($0 \leq x < 1$, $0 \leq y < 1$, $0 \leq x+y < 1$) and formed on the third layer,
    wherein a lattice constant of each of the plurality of layers is greater than LP3, and the plurality of layers are staked in an ascending order of lattice constant.

7. The method of claim 1, comprising doping the silicon substrate with a dopant.

8. The method of claim 7, wherein a doping concentration of the dopant is determined such that the silicon substrate has a resistivity of about 1 Ωcm or less.

9. The method of claim 1, wherein the silicon substrate comprises:
    a main portion;
    an edge portion surrounding the main portion; and
    a crack prevention portion formed on the edge portion to have a random crystalline surface direction.

10. The method of claim 9, wherein the crack prevention portion comprises a dielectric film or an uneven portion formed on a top surface of the edge portion.

11. The method of claim 9, wherein the crack prevention portion is formed by performing ion implantation on a top surface of the edge portion.

12. The method of claim 1, further comprising forming a device layer on the nitride semiconductor layer.

13. The method of claim 12, wherein the device layer comprises a light-emitting diode (LED) structure, a field-effect transistor (FET) structure, a high electron mobility transistor (HEMT) structure, or a Schottky diode structure.

14. The method of claim 1, further comprising forming an interface control layer between the buffer layer and the nitride semiconductor layer,
   wherein the interface control layer is grown according to a growth condition for controlling a roughness increase rate with respect to a roughness of the buffer layer.

15. The method of claim 14, wherein:
   the interface control layer has a thickness of about 2 nm to about 1000 nm, and
   a ratio of a roughness of the interface control layer to the roughness of the buffer layer is about 3 or less.

16. The method of claim 1, wherein the nitride semiconductor layer comprises a first-type semiconductor layer, an active layer, and a second-type semiconductor layer.

17. The method of claim 16, further comprising:
   removing the silicon substrate; and
   removing at least a portion of the buffer layer.

18. The method of claim 17, further comprising attaching a support substrate onto the second-type semiconductor layer before the removing of the silicon substrate.

19. The method of claim 17, further comprising, before the removing of the silicon substrate:
   forming an electrode structure comprising a first electrode contacting the first-type semiconductor layer and a second electrode contacting the second-type semiconductor layer, so as to inject a current into the active layer; and
   attaching a support substrate, which is connected electrically to at least one of the first electrode and the second electrode, onto the second-type semiconductor layer.

20. The method of claim 19, wherein the support substrate is a silicon substrate.

21. The method of claim 19, further comprising forming a wavelength conversion layer, which converts a wavelength of light that is generated by and emitted from the active layer, on the second-type semiconductor layer.

22. A method of manufacturing a semiconductor device, comprising:
   preparing a silicon substrate;
   forming a buffer layer on the silicon substrate; and
   forming a nitride semiconductor layer on the buffer layer,
   wherein the buffer layer comprises:
   a first layer that comprises $Al_xIn_yGa_{1-x-y}N$ ($0\leq x\leq 1$, $0\leq y\leq 1$, $0\leq x+y\leq 1$) and has a lattice constant LP1 smaller than a lattice constant LP0 of the silicon substrate;
   a second layer that is formed on the first layer, comprises $Al_xIn_yGa_{1-x-y}N$ ($0\leq x<1$, $0\leq y<1$, $0\leq x+y<1$), and has a lattice constant LP2 greater than LP1 and smaller than LP0; and
   a third layer that is formed on the second layer, comprises $Al_xIn_yGa_{1-x-y}N$ ($0\leq x<1$, $0\leq y<1$, $0\leq x+y<1$), and has a lattice constant LP3 smaller than LP2,
   wherein the second layer has a lattice constant distribution that increases along a thickness direction, and
   wherein the third layer has a lattice constant smaller than a lattice constant average of the second layer.

23. The method of claim 22, wherein the lattice constant distribution of the second layer increases continuously.

24. The method of claim 22, wherein the buffer layer further comprises a fourth layer that is formed on the third layer, comprises $Al_xIn_yGa_{1-x-y}N$ ($0\leq x<1$, $0\leq y<1$, $0\leq x+y<1$), and has a lattice constant distribution that increases along a thickness direction.

25. The method of claim 24, wherein the fourth layer has the same lattice constant as the second layer.

26. A method of manufacturing a semiconductor device, comprising:
   preparing a silicon substrate;
   forming a buffer layer on the silicon substrate;
   forming a nitride semiconductor layer having a plurality of nitride semiconductor layers on the buffer layer;
   forming at least one mask layer between the plurality of nitride semiconductor layers; and
   forming, on the at least one mask layer, at least one interlayer that compensates for a tensile stress between the plurality of nitride semiconductor layers,
   wherein the buffer layer comprises:
   a first layer $Al_xIn_yGa_{1-x-y}N$ ($0\leq x\leq 1$, $0\leq y\leq 1$, $0\leq x+y\leq 1$) and has a lattice constant LP1 smaller than a lattice constant LP0 of the silicon substrate,
   a second layer that is formed on the first layer, comprises $Al_xIn_yGa_{1-x-y}N$ ($0\leq x<1$, $0\leq y<1$, $0\leq x+y<1$), and has a lattice constant LP2 greater than LP1 and smaller than LP0, and
   a third layer that is formed on the second layer, comprises $Al_xIn_yGa_{1-x-y}N$ ($0\leq x<1$, $0\leq y<1$, $0\leq x+y<1$), and has a lattice constant LP3 smaller than LP2.

27. The method of claim 26, wherein the at least one mask layer comprises a silicon nitride or a titanium nitride.

28. The method of claim 27, wherein:
   the at least one mask layer comprises one selected from the group consisting of $Al_{x0}In_{y0}Ga_{1-x0-y0}N$ ($0\leq x0$, $y0\leq 1$, $x0+y0\leq 1$), step-grade $Al_xIn_yGa_{1-x-y}N$ ($0\leq x$, $y\leq 1$, $x+y\leq 1$), and $Al_{x1}In_{y1}Ga_{1-x1-y1}N/Al_{x2}In_{y2}Ga_{1-x2-y2}N$ ($0\leq x1$, $x2$, $y1$, $y2\leq 1$, $x1\neq x2$ or $y1\neq y2$) superlattices, and
   the at least one mask layer is formed to apply a compressive stress to the nitride semiconductor layer thereon.

* * * * *